US012805358B2

(12) United States Patent
Isono

(10) Patent No.: US 12,805,358 B2
(45) Date of Patent: Nov. 17, 2026

(54) SEMICONDUCTOR DEVICE AND VEHICLE

(71) Applicant: FUJI ELECTRIC CO., LTD., Kawasaki (JP)

(72) Inventor: Tomohiro Isono, Kawasaki (JP)

(73) Assignee: FUJI ELECTRIC CO., LTD., Kawasaki (JP)

( * ) Notice: Subject to any disclaimer, the term of this patent is extended or adjusted under 35 U.S.C. 154(b) by 314 days.

(21) Appl. No.: 18/756,425

(22) Filed: Jun. 27, 2024

(65) Prior Publication Data

US 2025/0029928 A1 Jan. 23, 2025

(30) Foreign Application Priority Data

Jul. 18, 2023 (JP) ................................. 2023-116797

(51) Int. Cl.

| | |
|---|---|
| ***H10W 70/65*** | (2026.01) |
| ***H10W 70/40*** | (2026.01) |
| ***H10W 74/00*** | (2026.01) |
| ***H10W 90/00*** | (2026.01) |

(52) U.S. Cl.

CPC ......... *H10W 70/65* (2026.01); *H10W 70/415* (2026.01); *H10W 70/461* (2026.01); *H10W 70/468* (2026.01); *H10W 90/00* (2026.01); *H10W 74/00* (2026.01); *H10W 90/763* (2026.01); *H10W 90/767* (2026.01); *H10W 90/792* (2026.01); *H10W 90/796* (2026.01)

(58) Field of Classification Search

CPC . H10W 70/65; H10W 70/415; H10W 70/461; H10W 70/468; H10W 90/00; H10W 74/00; H10W 90/763; H10W 90/767; H10W 90/792; H10W 90/796; H10W 70/424; H10W 70/481; H10W 72/90; H10W 72/20; H10W 90/701

See application file for complete search history.

(56) References Cited

U.S. PATENT DOCUMENTS

| | | | | |
|---|---|---|---|---|
| 2005/0208789 A1* | 9/2005 | Shirai | G02B 6/4201 257/E23.066 |
| 2019/0067159 A1* | 2/2019 | Nakata | H10W 40/22 |
| 2019/0088575 A1* | 3/2019 | Kato | H10D 12/411 |
| 2020/0294925 A1* | 9/2020 | Yamada | H10D 84/01 |
| 2023/0130373 A1* | 4/2023 | Nishiyama | H02M 1/327 257/703 |

FOREIGN PATENT DOCUMENTS

| | | |
|---|---|---|
| JP | 2012-104709 A | 5/2012 |
| WO | 2019/244492 A1 | 12/2019 |

* cited by examiner

*Primary Examiner* — Mark W Tornow

(74) *Attorney, Agent, or Firm* — Rabin & Berdo, P.C.

(57) ABSTRACT

A semiconductor device includes a wiring board, a semiconductor element disposed on the wiring board, and a lead having a bonding surface that is bonded to a main electrode of the semiconductor element by a bonding material. The main electrode includes a first pad and a second pad separated by an insulating layer extending in a first direction. The lead has at the bonding surface a recess that faces the main electrode so as to overlap the insulating layer and extends in the first direction. The recess has two outer ends in the first direction, one of which overlaps one end of the lead in plan view. The recess has a bottom surface that faces the main electrode of the semiconductor element, is not in contact with the bonding material and is continuous from the one of the two outer ends thereof to another end thereof in the first direction.

9 Claims, 18 Drawing Sheets

SEMICONDUCTOR DEVICE AND VEHICLE

CROSS-REFERENCE TO RELATED APPLICATION

This application is based upon and claims the benefit of priority to Japanese Patent Application No. 2023-116797, filed on Jul. 18, 2023, the entire contents of which are incorporated herein by reference.

BACKGROUND OF THE INVENTION

1. Technical Field

The present invention relates to a semiconductor device and a vehicle.

2. Description of the Related Art

Among semiconductor devices used in power conversion devices such as inverter devices, there is a semiconductor device in which a main electrode of a semiconductor element and a conductor plate are bonded to each other by a bonding material such as solder. One such semiconductor device is a semiconductor device in which a recessed portion housing the solder is formed on the conductor plate for the purpose of improving the bonding reliability (see, for example, WO 2019/244492 A and JP 2012-104709 A).

SUMMARY OF THE INVENTION

In the above-described semiconductor device, when the main electrode of the semiconductor element and the conductor plate are bonded to each other by the bonding material, the melted bonding material scatters and adheres to and remains on an unintended portion of a surface of the semiconductor element, which may cause a malfunction of the semiconductor device.

The present invention has been made in view of such a point, and an object of the present invention is to prevent the occurrence of the malfunction of the semiconductor device due to the scattering of the bonding material that bonds the main electrode of the semiconductor element and the conductor plate.

A semiconductor device according to one aspect of the present invention includes a wiring board, a semiconductor element disposed on the wiring board, and a lead bonded to a main electrode provided on an upper surface of the semiconductor element by a bonding material, in which the main electrode of the semiconductor element includes a first pad and a second pad separated by an insulating layer extending in a first direction, the lead has a recessed portion having a bottom surface displaced to an upper surface side opposite to a bonding surface facing the main electrode of the semiconductor element and extending in the first direction at a position of the bonding surface facing the insulating layer, and the recessed portion of the lead has at least one end of both ends in the first direction positioned at an end of the lead in the first direction in a plan view of the bonding surface, and a region of the bottom surface not in contact with the bonding material is continuous from one end to the other end of the recessed portion in the first direction.

According to the present invention, it is possible to prevent the occurrence of the malfunction of the semiconductor device due to the scattering of the bonding material that bonds the main electrode of the semiconductor element and the conductor plate.

DETAILED DESCRIPTION

Figure 1:
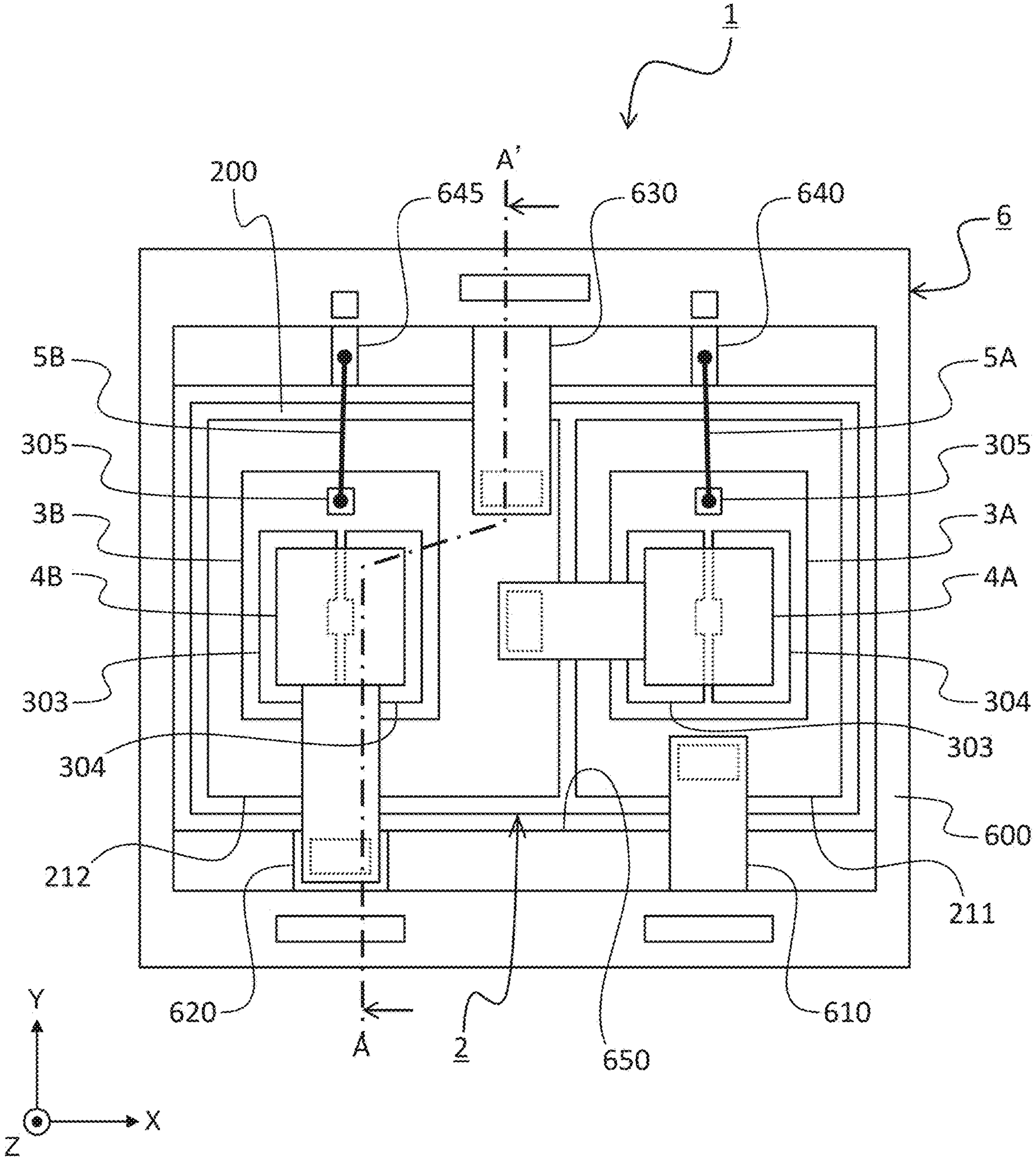
FIG. 1 is a top view illustrating a configuration example of a semiconductor device according to an embodiment.

Hereinafter, an embodiment of the present invention will be described in detail with reference to the drawings. Note that the X axis, the Y axis, and the Z axis in each of the drawings to be referred to are illustrated for the purpose of defining a plane and a direction in the exemplified semiconductor device or the like. The X, Y, and Z axes are orthogonal to each other and form a right-handed system. In the following description, a direction parallel to the X axis is referred to as an X direction, a direction parallel to the Y axis is referred to as a Y direction, and a direction parallel to the Z axis is referred to as a Z direction. In addition, in a case where each of the X direction, the Y direction, and the Z direction is associated with a direction of an arrow (positive or negative) of the X axis, the Y axis, and the Z axis illustrated, a "positive side" or a "negative side" is added.

In the present specification, the Z direction may be referred to as a vertical direction. In the present specification, "on" and "upper side" are intended to be on the positive side in the Z direction with respect to the reference surface, member, position, and the like, and "below" and "lower side" are intended to be on the negative side in the Z direction with respect to the reference surface, member, position, and the like. For example, when it is described that "the member B is disposed on the member A", the member B is disposed on the positive side in the Z direction as viewed from the member A. Further, when the "upper surface of the member A" is described, the surface is positioned at the end of the member A on the positive side in the Z direction and faces the positive side in the Z direction. In the present specification, "top view" is intended as a plan view when a target article (for example, a semiconductor device or the like) is viewed from the positive side in the Z direction. In the present specification, the "side view" is intended as a plan view when a target article is viewed from the negative side in the X direction or the positive side in the X direction, and the plan view when viewed from the negative side in the X direction may be referred to as a "left side view", and the plan view when viewed from the positive side in the X direction may be referred to as a "right side view". Such directions and surfaces are terms used for convenience of description. Thus, depending on a posture of attachment of the semiconductor device, a correspondence relationship with directions of the X, Y, and Z axes may vary. For example, in the present specification, a surface of a semiconductor element facing a wiring board is referred to as a lower surface, and a surface opposite to the lower surface is referred to as an upper surface, but the terms are not limited thereto, and the surface facing the wiring board may be referred to as the upper surface, and the surface opposite thereto may be referred to as the lower surface. The lower surface and the upper surface of the semiconductor element may be referred to as side surfaces. Furthermore, an aspect ratio and a size relationship between the members in each drawing are merely schematically represented, and do not necessarily coincide with a relationship in a semiconductor device or the like actually manufactured. For convenience of description, it is also assumed that the size relationship between the members is exaggerated.

In addition, a semiconductor device to be illustrated in the following description may be applied to, for example, a power conversion device such as an industrial or electrical (for example, an in-vehicle motor's) inverter device. Thus, in the following description, detailed description of the same or similar configuration, function, operation, manufacturing method, and the like as those of the known semiconductor device will be omitted.

Figure 2:
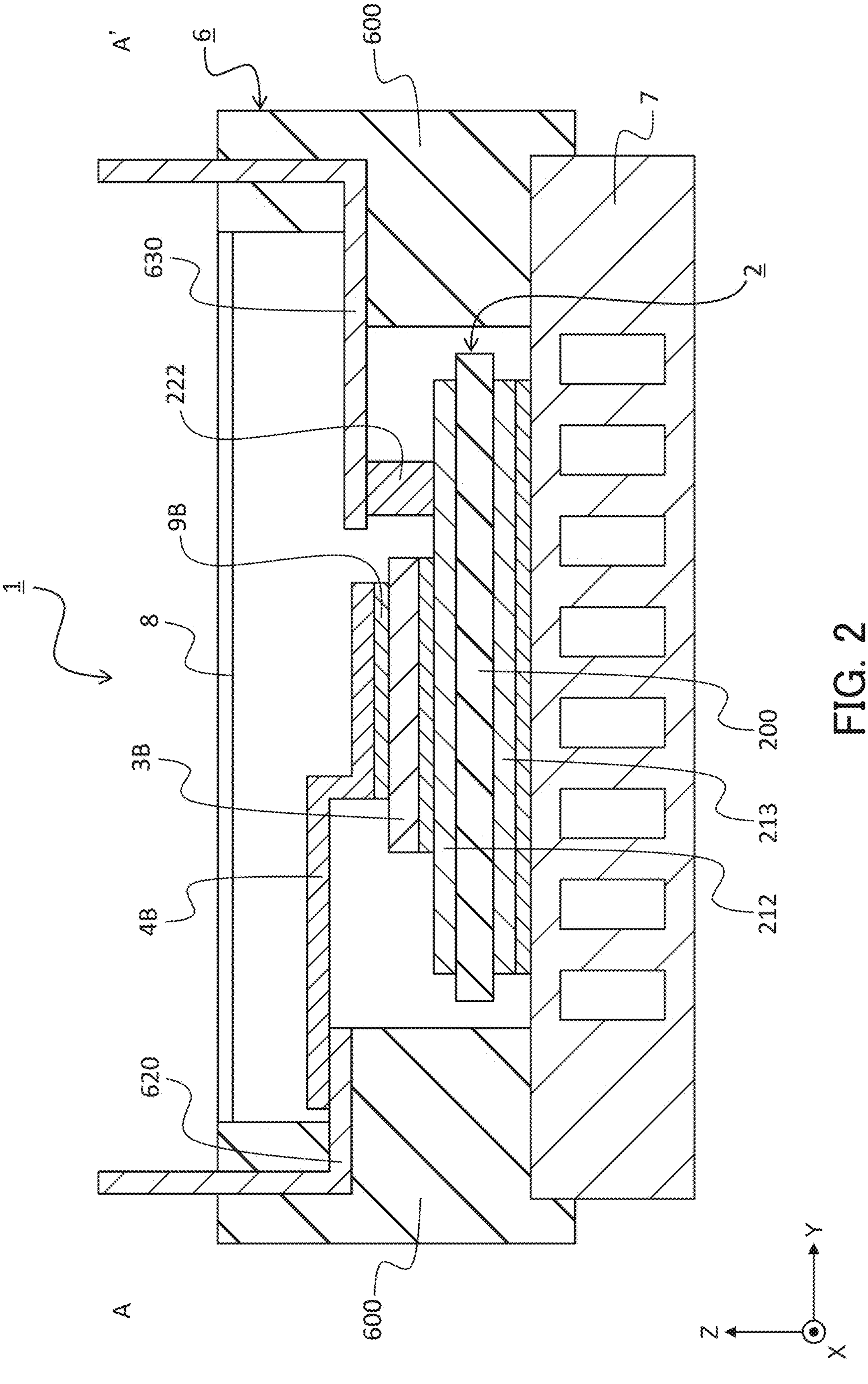
FIG. 2 is a cross-sectional side view illustrating a configuration example of the semiconductor device taken along line A-A' in FIG. 1.

FIG. 1 is a top view illustrating a configuration example of a semiconductor device according to an embodiment. FIG. 2 is a cross-sectional side view illustrating a configuration example of the semiconductor device taken along line A-A' in FIG. 1. The cross-sectional side view in FIG. 2 illustrates a right side view of a portion of the semiconductor device taken along line A-A' in FIG. 1 on the left side of line A-A'. In addition, in FIG. 2, hatching indicating a cross section of a sealing material sealing the semiconductor element or the like is omitted.

A semiconductor device 1 illustrated in FIGS. 1 and 2 includes a wiring board 2, semiconductor elements 3A and 3B, leads 4A and 4B, bonding wires 5A and 5B, a case 6, a cooler 7, and a sealing material 8.

The wiring board 2 includes an insulating substrate 200, a first conductor pattern 211 and a second conductor pattern 212 provided on an upper surface of the insulating substrate 200, and a third conductor pattern 213 provided on a lower surface of the insulating substrate 200. The wiring board 2 can be, for example, a direct copper bonding (DCB) substrate or an active metal brazing (AMB) substrate. The wiring board 2 may be referred to as a laminated substrate, an insulating circuit board, or the like.

The insulating substrate 200 is not limited to a specific substrate. The insulating substrate 200 may be, for example, a ceramic substrate made of a ceramic material such as aluminum oxide ($Al_2O_3$), aluminum nitride (AlN), silicon nitride ($Si_3N_4$), or a composite material of aluminum oxide ($Al_2O_3$) and zirconium oxide ($ZrO_2$). The insulating substrate 200 may be, for example, a substrate obtained by molding an insulating resin such as epoxy resin, a substrate obtained by impregnating a base material such as a glass fiber with an insulating resin, a substrate obtained by coating a surface of a flat plate-shaped metal core with an insulating resin, or the like.

The first conductor pattern 211 and the second conductor pattern 212 provided on the upper surface of the insulating substrate 200 function as wiring parts and are formed of, for example, metal plates, metal foils, or the like such as copper or aluminum. The first conductor pattern 211 and the second conductor pattern 212 may be also referred to as conductor layers, conductor plates, conductive layers, wiring patterns, or the like.

Each of the two semiconductor elements 3A and 3B disposed on the upper surface of the wiring board 2 includes, for example, a reverse conducting (RC)-insulated gate bipolar transistor (IGBT) element in which an IGBT element that is a switching element and a function of a diode element such as a free wheeling diode (FWD) element connected in anti-parallel to the IGBT element are integrated. In each of this type of semiconductor elements 3A and 3B, a first main electrode (not illustrated) is provided on the lower surface, and second main electrodes 303, 304 and a control electrode (gate electrode) 305 are provided on the upper surface. When the switching elements of the semiconductor elements 3A and 3B are IGBT elements, the first main electrode on the lower surface side may be referred to as a collector electrode, and the second main electrodes 303, 304 on the upper surface side may be referred to as emitter electrodes. In addition, the substrate on which the switching elements and the diode elements of the semiconductor elements 3A and 3B are formed is not limited to a silicon substrate, and may be, for example, a silicon carbide (SiC) substrate, a gallium nitride (GaN) substrate, or the like. In the following description, when the two semiconductor elements 3A and 3B are distinguished from each other, they are referred to as a first semiconductor element 3A and a second semiconductor element 3B. When not distinguished from each other, the two semiconductor elements may be referred to as "semiconductor element 3." In addition, in the following description, the two second main electrodes 303, 304 provided on the upper surface of the single semiconductor element 3 may be referred to as a first pad 303 and a second pad 304, respectively.

In the semiconductor device 1 in FIGS. 1 and 2, the first semiconductor element 3A is disposed on an upper surface of the first conductor pattern 211, and the second semiconductor element 3B is disposed on an upper surface of the second conductor pattern 212. The first conductor pattern

211 is bonded to the first main electrode (not illustrated) provided on the lower surface of the first semiconductor element 3A by a bonding material (not illustrated). Further, the second conductor pattern 212 is bonded to the first main electrode (not illustrated) provided on the lower surface of the second semiconductor element 3B by a bonding material (not illustrated). The bonding material may be a known bonding material such as solder.

The first main electrode provided on the lower surface of the first semiconductor element 3A is electrically connected to a first main terminal 610 provided on the case 6 via the first conductor pattern 211. The method for electrically connecting the first conductor pattern 211 and the first main terminal 610 is not limited to a specific method. The first conductor pattern 211 and the first main terminal 610 are electrically connected to each other via, for example, a block-shaped conductor member (conductor block) provided on the upper surface of the first conductor pattern 211. The second main electrodes 303, 304 provided on the upper surface of the first semiconductor element 3A are electrically connected to the second conductor pattern 212 via the first lead 4A. The first lead 4A is formed by bending a conductor plate such as a copper plate, and may be referred to as a lead frame or the like. A part of the first lead 4A is bonded to the second main electrodes 303, 304 of the first semiconductor element 3A by known bonding materials 901, 902 (see FIG. 10A) such as solder, and another part is bonded to the second conductor pattern 212 by a known bonding material (not illustrated) such as solder. In the following description, the bonding material 901 is referred to as a first solder 901, and the bonding material 902 is referred to as a second solder 902. In addition, the control electrode 305 provided on the upper surface of the first semiconductor element 3A is electrically connected to a control terminal 640 provided on the case 6 by the bonding wire 5A. The number of control electrodes 305 is not limited to one, and two or more control electrodes may be disposed. The first lead 4A has a recessed portion that continuously extends between two ends of the first lead 4A in Y direction, i.e., two ends (two outer ends) of the recessed portion are respectively located at the two ends of the first lead 4A. The details of the recessed portion are explained later.

The first main electrode provided on the lower surface of the second semiconductor element 3B is electrically connected to a third main terminal 630 provided on the case 6 via the second conductor pattern 212. The method for electrically connecting the second conductor pattern 212 and the third main terminal 630 is not limited to a specific method. The second conductor pattern 212 and the third main terminal 630 are electrically connected to each other via, for example, a block-shaped conductor member (conductor block) 222 provided on the upper surface of the second conductor pattern 212. The second main electrodes 303, 304 provided on the upper surface of the second semiconductor element 3B are electrically connected to a second main terminal 620 provided on the case 6 via the second lead 4B. Similarly to the first lead 4A, the second lead 4B is formed by bending a conductor plate such as a copper plate, and may be referred to as a lead frame or the like. A part of the second lead 4B is bonded to the second main electrodes 303, 304 of the second semiconductor element 3B by a known bonding material 9B such as solder, and another part is bonded to the second main terminal 620. The method for electrically connecting the second lead 4B and the second main terminal 620 is not limited to a specific method. The second lead 4B is bonded to the second main terminal 620 by, for example, laser welding, ultrasonic bonding, or the like. In addition, the control electrode 305 provided on the upper surface of the second semiconductor element 3B is electrically connected to a control terminal 645 provided on the case 6 by the bonding wire 5B. The second lead 4B has a recessed portion that continuously extends from one end of the second lead 4B in Y direction i.e., one of two ends (one of two outer ends) of the recessed portion is located at one end of the second lead 4B. The details of the recessed portion are explained later.

Note that the method for electrically connecting two conductive members in the semiconductor device 1 may be a method different from the above-described method. For example, the first conductor pattern 211 of the wiring board 2 and the first main terminal 610 of the case 6 may be electrically connected, and the second conductor pattern 212 and the third main terminal 630 may be electrically connected using a bonding material such as solder. In addition, the second lead 6B and the second main terminal 620 may be electrically connected via, for example, a conductor pattern different from the first conductor pattern 211 and the second conductor pattern 212 provided on the upper surface of the wiring board 2 (insulating substrate 200).

The third conductor pattern 213 provided on the lower surface of the insulating substrate 200 functions as a heat conducting member that conducts heat generated by the first semiconductor element 3A and the second semiconductor element 3B to the cooler 7, and is formed of, for example, a metal plate, a metal foil, or the like such as copper or aluminum. The third conductor pattern 213 is bonded to an upper surface of the cooler 7 by a bonding material (not illustrated) such as solder. The cooler 7 includes a flow path of refrigerant in which a plurality of fins are disposed, and performs heat exchange between the fins whose temperature has increased by heat from the first semiconductor element 3A and the second semiconductor element 3B and the refrigerant flowing through the flow path. The cooler 7 may be any component in the semiconductor device 1 according to the present embodiment. The semiconductor device 1 according to the present embodiment may be, for example, a device in which the wiring board 2 is bonded to an upper surface of a heat radiation base different from the cooler 7, and in which the heat radiation base is thermally connected to the cooler 7 separate from the semiconductor device 1. In this type of semiconductor device 1, the heat radiation base and the cooler 7 may be brought into close contact with each other by, for example, a thermal conductive material such as a thermal grease or a thermal compound.

The case 6 includes a case member 600 having a housing portion 650 capable of housing the wiring board 2 disposed on the upper surface of the cooler 7, the first semiconductor element 3A and the second semiconductor element 3B, the first lead 4A and the second lead 4B, the bonding wires 5A and 5B, and the like, and the above-described first main terminal 610, second main terminal 620, third main terminal 630, control terminal 640, and control terminal 645 described above.

The case member 600 of the case 6 illustrated in FIGS. 1 and 2 has a substantially annular shape in a top view having the housing portion (hollow portion) 650 with an upper end and a lower end open, and the wiring board 2 and the like are housed in the housing portion 650. Each of the above-described first main terminal 610, second main terminal 620, third main terminal 630, control terminal 640, and control terminal 645 has an inner terminal portion exposed inside the housing portion 650 of the case member 600 and an outer terminal portion exposed from the upper surface of the case member 600, and is provided integrally with the case member 600. This type of case 6 is manufactured by a known manufacturing method such as a method using insert molding. The shapes of the first main terminal 610, the second main terminal 620, the third main terminal 630, the control terminal 640, and the control terminal 645 are not limited to the shapes illustrated in FIGS. 1 and 2. For example, each of the first main terminal 610, the second main terminal 620, and the third main terminal 630 may be bent such that the outer terminal portion exposed from the upper surface of the case member 600 is along the upper surface of the case member 600.

In the case 6, for example, the case member 600 is adhered to the upper surface of the cooler 7 (or the heat radiation base) with an adhesive. The housing portion 650 of the case 6 is filled with a sealing material 8 that seals the wiring board 2, the first semiconductor element 3A and the second semiconductor element 3B, the first lead 4A and the second lead 4B, the bonding wires 5A and 5B, and the like. The sealing material 8 may be an epoxy resin, silicone gel, or the like, for example. The sealing material 8 may be a combination of two or more types of insulating materials. For example, an opening on the upper end side of the housing portion 650 of the case 6 may be covered with a lid.

The semiconductor device 1 illustrated in FIGS. 1 and 2 includes one single-phase inverter circuit. By using three such semiconductor devices 1, for example, a three-phase inverter device can be formed.

Figure 3:
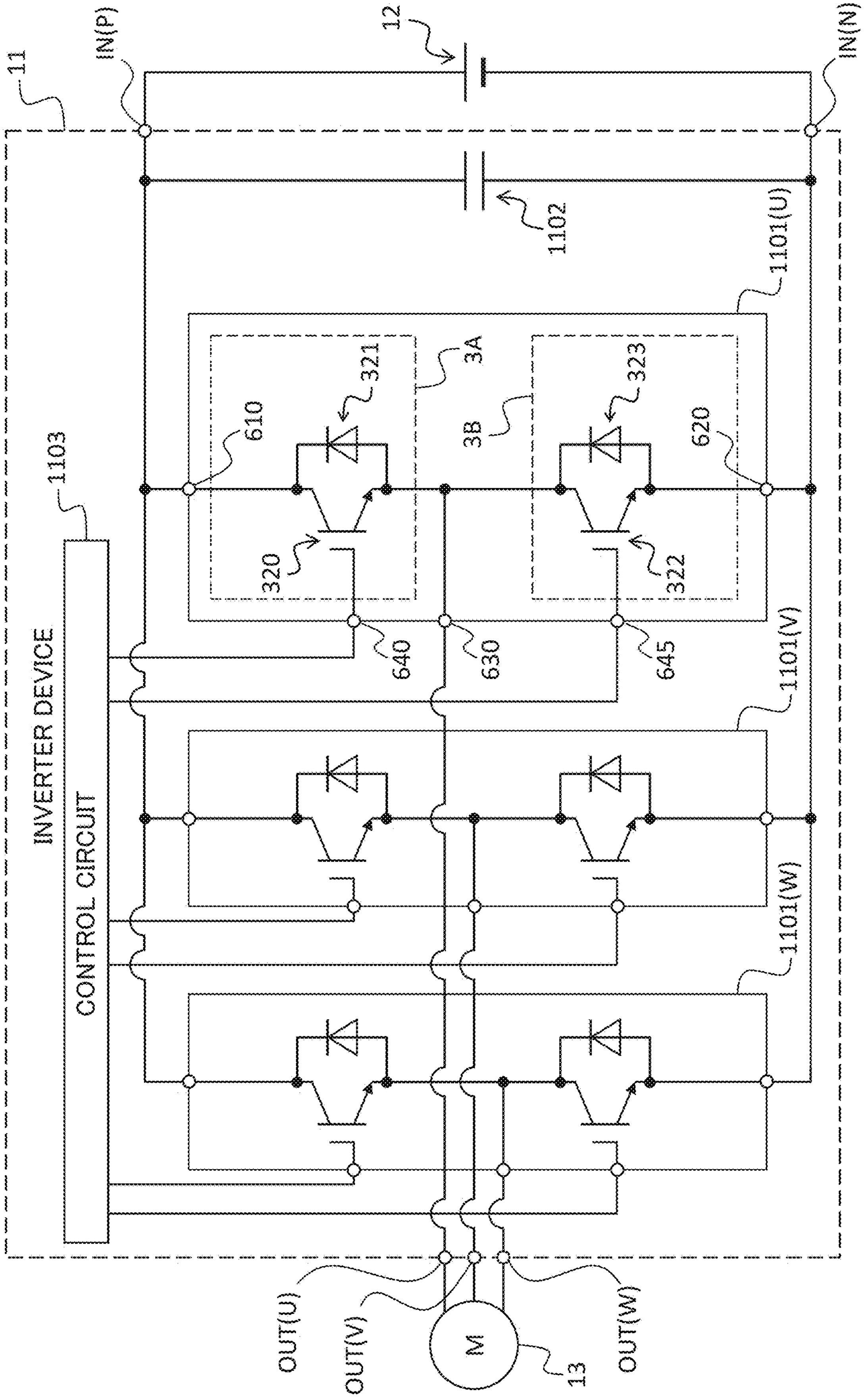
FIG. 3 is a diagram illustrating a circuit configuration example of an inverter device to which the semiconductor device in FIG. 1 is applied.

FIG. 3 is a diagram illustrating a circuit configuration example of an inverter device to which the semiconductor device in FIG. 1 is applied.

In FIG. 3, as a circuit configuration example of the inverter device 11, an example of the circuit configuration of a voltage-type three-phase inverter device is illustrated. The inverter device 11 includes three single-phase inverter circuits 1101 (U), 1101 (V), and 1101 (W), a smoothing capacitor 1102, and a control circuit 1103. The single-phase inverter circuit 1101 (U) converts a direct current into an alternating current and outputs the alternating current as a U-phase alternating current. The single-phase inverter circuit 1101 (V) converts a direct current into an alternating current and outputs the alternating current as a V-phase alternating current. The single-phase inverter circuit 1101 (W) converts a direct current into an alternating current and outputs the alternating current as a W-phase alternating current. In the present specification, three phases in the three-phase alternating current are referred to as the U phase, the V phase, and the W phase. However, the three phases may be referred to as other terms.

In the inverter device 11, the three single-phase inverter circuits 1101 (U), 1101 (V), and 1101 (W) and the smoothing capacitor 1102 are connected in parallel. The circuit configuration of each of the three single-phase inverter circuits 1101 (U), 1101 (V), and 1101 (W) illustrated as an equivalent circuit in FIG. 3 corresponds to the circuit formed in one semiconductor device 1 described above with reference to FIGS. 1 and 2.

The inverter device 11 includes a first input end IN (P) that is connected to a positive electrode of a direct current power supply 12, a second input end IN (N) that is connected to a negative electrode of the direct current power supply 12, and output ends OUT (U), OUT (V), and OUT (W) that output three-phase alternating currents. The first input end IN (P) is connected to the first main terminal 610 of the semiconductor device 1, and the second input end IN (N) is connected to the second main terminal 620 of the semiconductor device 1. The output ends OUT (U), OUT (V), and OUT (W) are connected to the third main terminal 630 of the semiconductor device 1.

Each of the single-phase inverter circuits 1101 (U), 1101 (V), and 1101 (W) illustrated in FIG. 3 is a half-bridge inverter circuit. In the single-phase inverter circuit 1101 (U), a collector electrode of a switching element 320 (for example, an IGBT element) in the first semiconductor element 3A connected between the first input end IN (P) and the output end OUT (U), which may be referred to as an upper arm, is connected to the first input end IN (P) via the first main terminal 610. Further, in the single-phase inverter circuit 1101 (U), an emitter electrode of a switching element 322 in the second semiconductor element 3B connected between the second input end IN (N) and the output end OUT (U), which may be referred to as a lower arm, is connected to the second input end IN (N) via the second main terminal 620. The emitter electrode of the switching element 320 of the upper arm and the collector electrode of the switching element 322 of the lower arm in the single-phase inverter circuit 1101 (U) are connected to the output end OUT (U) that outputs the U-phase alternating current in the three-phase alternating currents via the third main terminal 630. A diode element 321 is connected in anti-parallel to the switching element 320 of the upper arm, and a diode element 323 is connected in anti-parallel to the switching element 322 of the lower arm. The other two single-phase inverter circuits 1101 (V) and 1101 (W) have a configuration in which the output end OUT (U) in the single-phase inverter circuit 1101 (U) described above are replaced with the output ends OUT (V) and OUT (W), respectively.

Alternating currents output from the single-phase inverter circuits 1101 (U), 1101 (V), and 1101 (W) are controlled by a control signal applied from the control circuit 1103 to the gate of the switching element 320 of the upper arm (the control electrode 305 of the first semiconductor element 3A) via the control terminal 640 and a control signal applied to the gate of the switching element 322 of the lower arm (the control electrode 305 of the second semiconductor element 3B) via the control terminal 645 such that the phases are shifted from each other by 120 degrees. The output ends OUT (U), OUT (V), and OUT (W) of the inverter device 11 are connected to a load (for example, AC motor) 13 that operates with an alternating current.

Note that the circuit configuration of the inverter device 11 including the semiconductor device 1 of the present embodiment is not limited to the circuit configuration illustrated in FIG. 3. In addition, the operation of the inverter device 11 including the semiconductor device 1 of the present embodiment is also not limited to a specific operation. For example, one semiconductor device 1 may include the three single-phase inverter circuits 1101 (U), 1101 (V), and 1101 (W) illustrated in FIG. 3. In other words, the semiconductor device 1 may have a configuration in which three sets of the wiring board 2, the first semiconductor element 3A and the second semiconductor element 3B, the first lead 4A and the second lead 4B, and the bonding wires 5A and 5B illustrated in FIGS. 1 and 2 are housed in one case 6. Furthermore, for example, the inverter circuit included in the semiconductor device 1 is not limited to the half-bridge circuit described above with reference to FIG. 3, and may be a full-bridge inverter circuit.

Moreover, the inverter device 11 described above with reference to FIG. 3 is merely an example of a device to which the semiconductor device 1 according to the present embodiment is applied.

The switching elements 320 and 322 of the first semiconductor element 3A and the second semiconductor element 3B are not limited to the IGBT element described above, and may be configured by, for example, a power metal oxide semiconductor field effect transistor (MOSFET), a bipolar junction transistor (BJT), or the like. When the switching element is a MOSFET element, the main electrodes on the lower surface sides of the first semiconductor element 3A and the second semiconductor element 3B may be referred to as drain electrodes, and the main electrodes 303, 304 on the upper surface sides may be referred to as source electrodes. Furthermore, the diode elements 321 and 323 may include, for example, a schottky barrier diode (SBD), a junction barrier schottky (JBS) diode, a merged PN schottky (MPS) diode, a PN diode, or the like. Moreover, the control electrodes 305 provided on the upper surfaces of the first semiconductor element 3A and the second semiconductor element 3B may include a gate electrode and an auxiliary electrode. For example, the auxiliary electrode may be an auxiliary emitter electrode or an auxiliary source electrode electrically connected to the main electrode on the upper surface side and serving as a reference potential with respect to a gate potential. Furthermore, the auxiliary electrode may be a temperature sensing electrode that is electrically connected to a temperature sensing unit that may be included in the inverter device 11 or the like and measures temperatures of the first semiconductor element 3A and the second semiconductor element 3B. These electrodes (second main electrodes 303, 304, and the control electrode 305 including the gate electrode and the auxiliary electrode) formed on the upper surfaces of the first semiconductor element 3A and the second semiconductor element 3B may be collectively referred to as upper surface electrodes. Moreover, a substrate on which the switching elements 320 and 322 and the diode elements 321 and 323 are formed is not limited to a silicon substrate, and may be, for example, a silicon carbide (SiC) substrate, a gallium nitride (GaN) substrate, or the like.

In addition, the switching element and the diode element described as being included in one semiconductor element in the single-phase inverter circuit described above with reference to FIG. 3 may be provided by separate semiconductor elements. For example, the switching element 320 and the diode element 321 of the upper arm may be provided by a semiconductor element in which the switching element 320 is formed and a semiconductor element in which the diode element 321 is formed. The shape, arrangement number, arrangement location, and the like of the semiconductor element can appropriately be changed. The layout of the conductor pattern as the wiring component provided on the upper surface side of the wiring board 2 is changed according to the type and shape of the semiconductor element, the number of the semiconductor elements to be arranged, the location of the semiconductor elements to be arranged, and the like.

In the semiconductor device 1 according to the present embodiment, the second main electrode such as the emitter electrode (or the source electrode) provided on the upper surface of the single semiconductor element 3 is divided into the first pad 303 and the second pad 304 as illustrated in FIG. 1.

Figure 4:
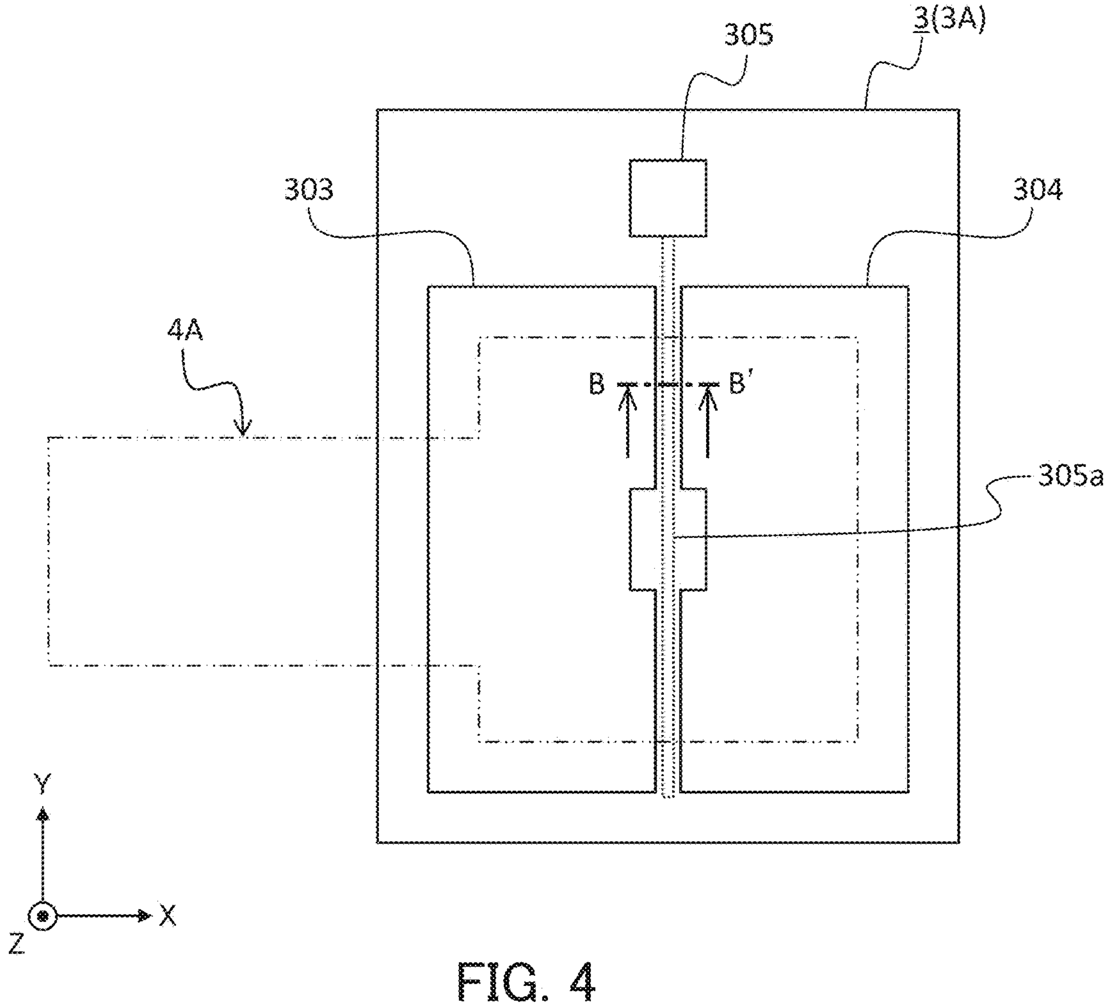
FIG. 4 is a top view illustrating a configuration example of an upper surface electrode of a semiconductor element.
Figure 5:
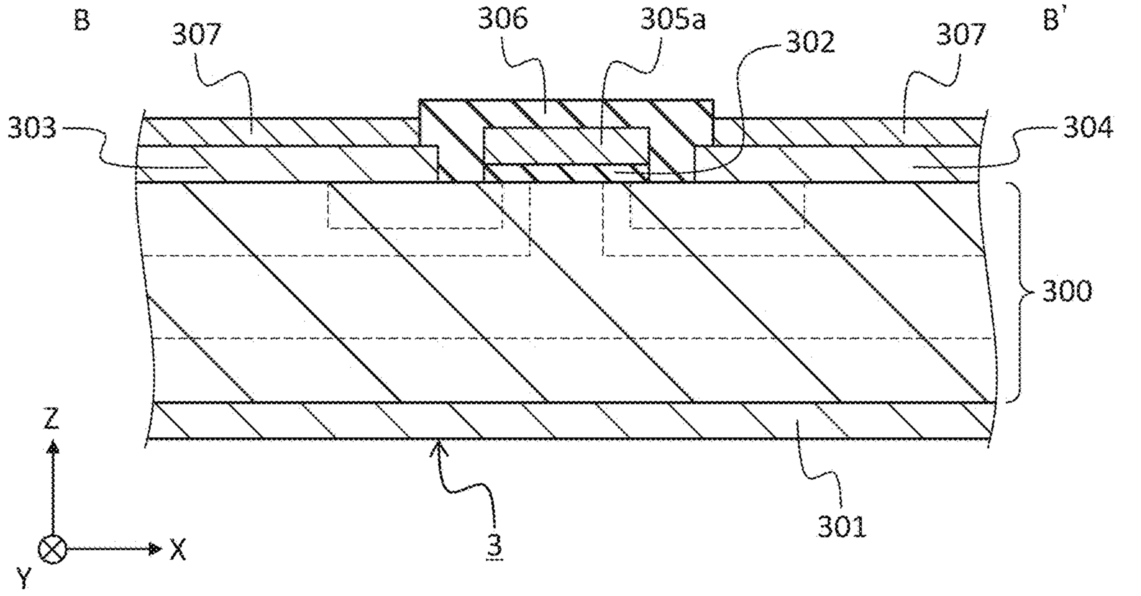
FIG. 5 is a cross-sectional view illustrating a configuration example of the semiconductor element at a position of line B-B' in FIG. 4.

FIG. 4 is a top view illustrating a configuration example of the upper surface electrode of the semiconductor element. FIG. 5 is a cross-sectional view illustrating a configuration example of the semiconductor element at a position of line B-B' in FIG. 4.

In the semiconductor element 3 used in the semiconductor device 1 according to the present embodiment, for example, as illustrated in FIGS. 4 and 5, the first main electrode 301 (collector electrode or drain electrode) is formed on a lower surface of a semiconductor substrate 300. On an upper surface of the semiconductor substrate 300, the second main electrodes 303, 304 (emitter electrode or source electrode) and the control electrode 305 as a gate electrode are formed. The control electrode 305 is formed on the upper surface of the semiconductor substrate 300 via an insulating film 302 that may be referred to as a gate insulating film, for example. The second main electrode is divided into the first pad 303 and the second pad 304, and a runner portion 305*a* extending from the control electrode 305 along the upper surface of the semiconductor substrate 300 passes between the first pad 303 and the second pad 304 on the upper surface of the semiconductor substrate 300. The runner portion 305*a* is covered with an insulating layer 306.

A plating layer 307 that improves the bonding reliability with the bonding material is formed on the upper surfaces of the first pad 303 and the second pad 304. The plating layer 307 is also divided by the insulating layer 306 covering the runner portion 305*a* of the control electrode 305.

Note that the configuration of the semiconductor element 3 is not limited to the configuration illustrated in FIGS. 4 and 5.

When the semiconductor device 1 is manufactured using the semiconductor element 3 described above with reference to FIGS. 4 and 5, a malfunction of the semiconductor element 3 may occur due to the scattering of the bonding material that bonds the second main electrode of the semiconductor element 3 and the lead. With reference to FIGS. 6A to 6F, the scattering of the bonding material and the malfunction will be described.

Figure 6A:
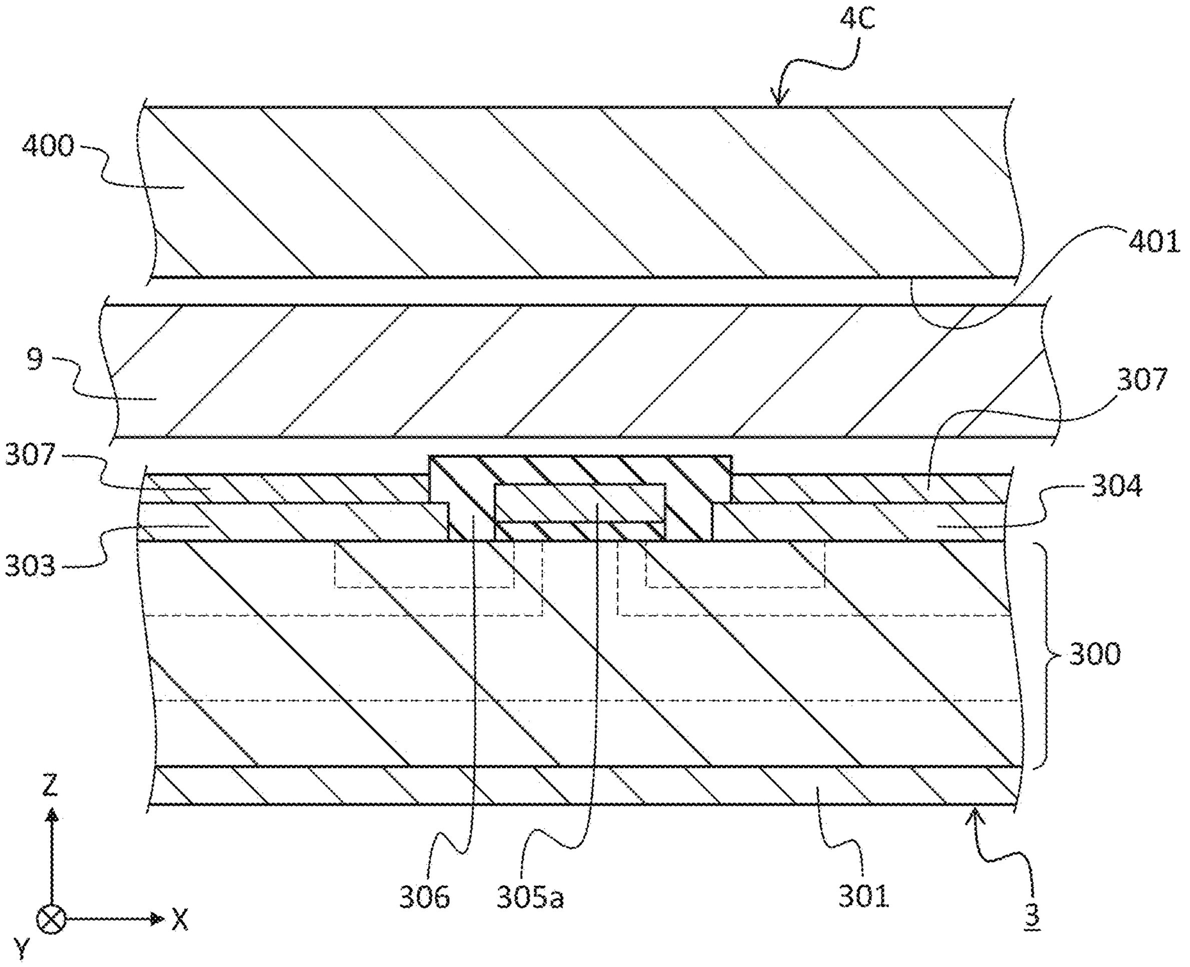
FIG. 6A is a cross-sectional view illustrating a conventional example of a lead bonded to the main electrode on the upper surface of the semiconductor element.
Figure 6B:
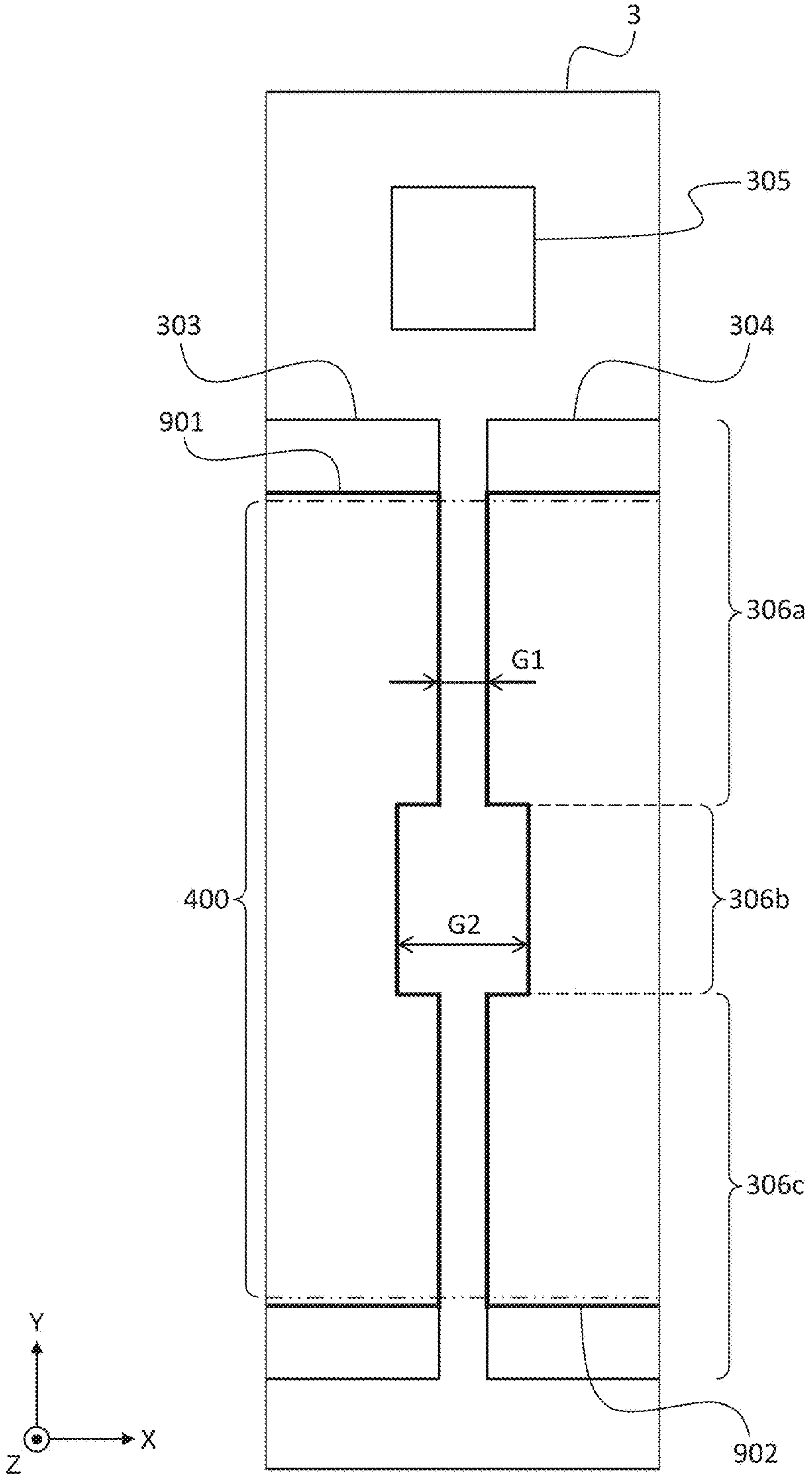
FIG. 6B is a partial top view illustrating a preferred example of a planar shape of a melted bonding material.
Figure 6C:
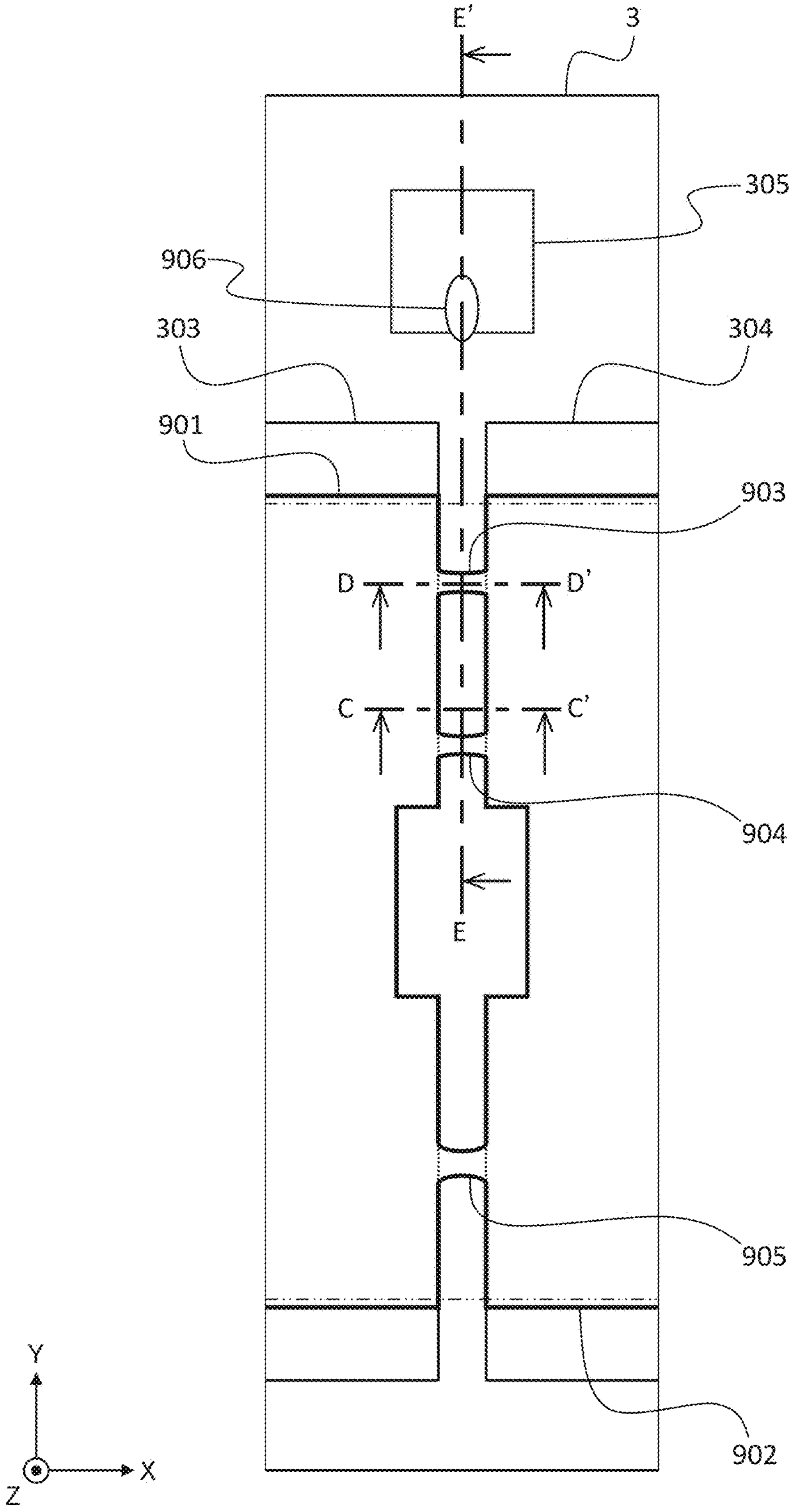
FIG. 6C is a partial top view illustrating an example of a bridge generated in the melted bonding material.
Figure 6D:
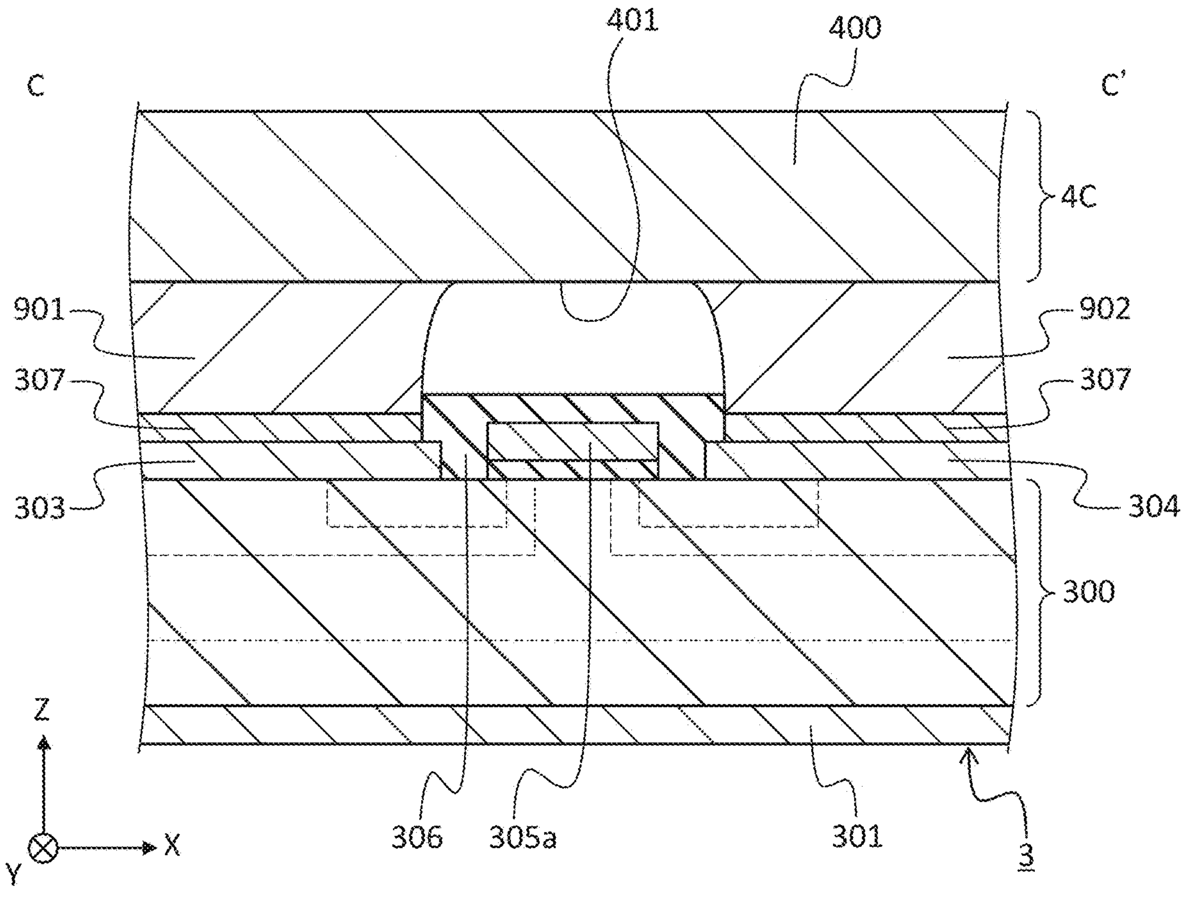
FIG. 6D is a cross-sectional view illustrating a state of the bonding material at a position of C-C' line in FIG. 6C.
Figure 6E:
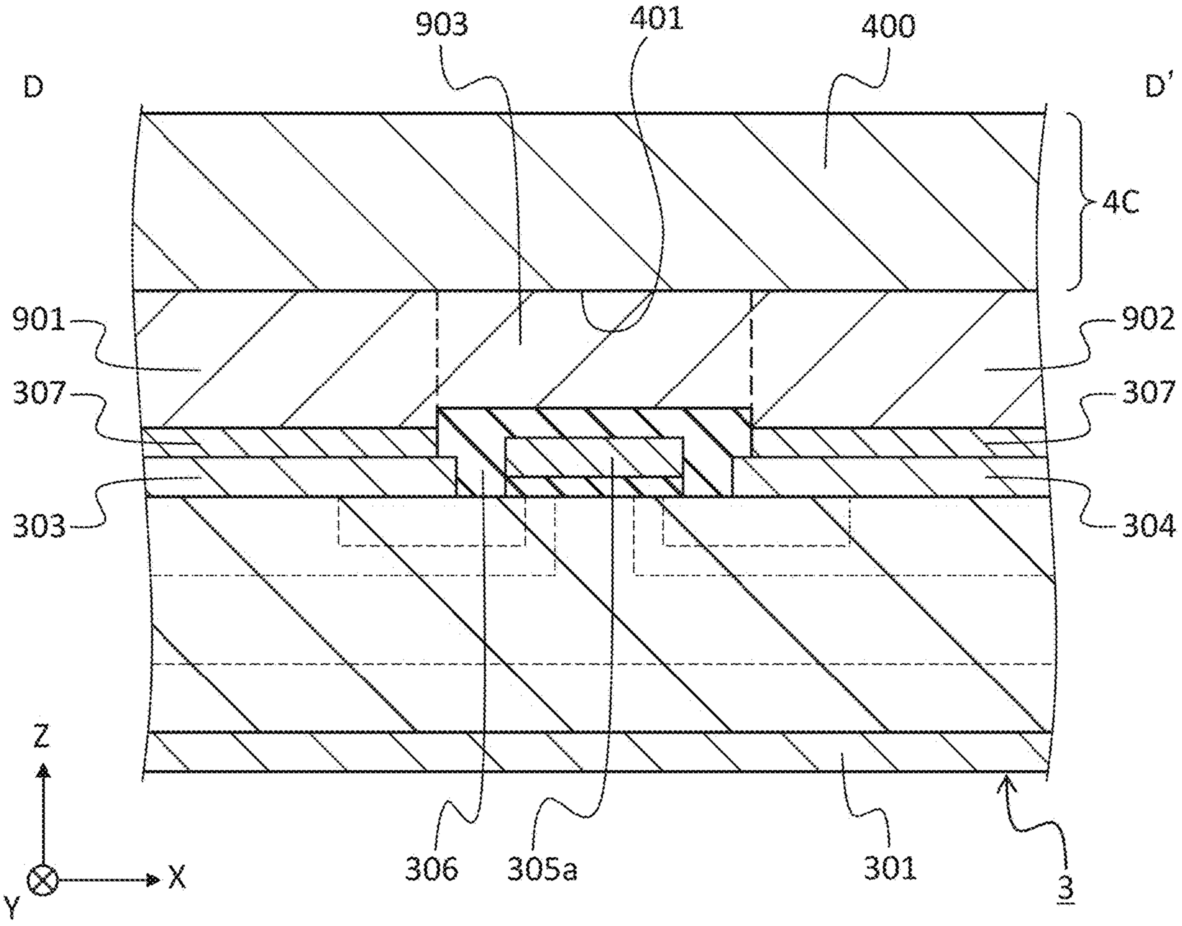
FIG. 6E is a cross-sectional view illustrating a state of the bonding material at a position of D-D' line in FIG. 6C.
Figure 6F:
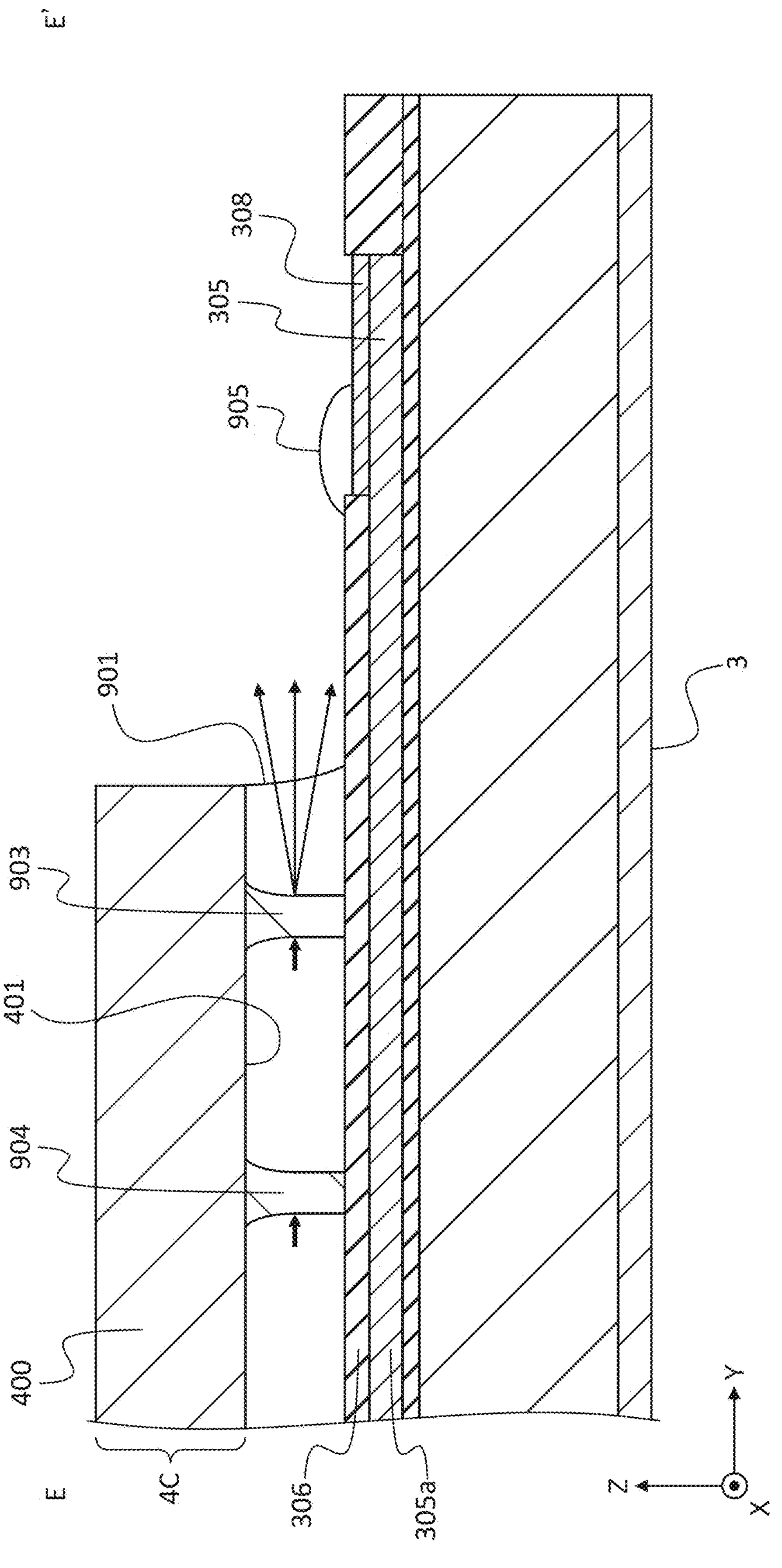
FIG. 6F is a cross-sectional view illustrating a state of the bonding material at a position of E-E' line in FIG. 6C.

FIG. 6A is a cross-sectional view illustrating a conventional example of the lead bonded to the main electrode on the upper surface of the semiconductor element. FIG. 6B is a partial top view illustrating a preferred example of a planar shape of a melted bonding material. FIG. 6C is a partial top view illustrating an example of a bridge generated in the melted bonding material. FIG. 6D is a cross-sectional view illustrating a state of the bonding material at a position of C-C' line in FIG. 6C. FIG. 6E is a cross-sectional view illustrating a state of the bonding material at a position of D-D' line in FIG. 6C. FIG. 6F is a cross-sectional view illustrating a state of the bonding material at a position of E-E' line in FIG. 6C.

FIG. 6A illustrates a lead 4C having a flat bonding surface 401 (surface facing the upper surface of the semiconductor element 3) as a conventional example of the lead bonded to the main electrode (the first pad 303 and the second pad 304) on the upper surface of the semiconductor element 3. When the first pad 303 and the second pad 304 on the upper surface of the semiconductor element 3 are bonded to the lead 4C, a plate-shaped solder 9 is disposed between the upper surface of the semiconductor element 3 and the lead 4C, and the plate-shaped solder 9 is heated and melted. Before heating and melting, the plate-shaped solder 9 is also present on the insulating layer 306 (in other words, between the insulating layer 306 and the bonding surface 401 of the lead 4C) that separates the first pad 303 and the second pad 304. However, since the surface of the insulating layer 306 has lower solder wettability than the plating layer 307 formed on the surfaces of the first pad 303 and the second pad 304, the melted solder on the insulating layer 306 flows onto the first pad 303 and the second pad 304 when the plate-shaped solder 9 is heated and melted. For this reason, as illustrated in FIGS. 6B and 6C, the heated and melted solder 9 is separated into the first solder 901 on the first pad 303 and the second solder 902 on the second pad 304. In other words, a cavity penetrating the solder layer along the extending direction of the insulating layer 306 is generated between the semiconductor element 3 and the lead 4.

As illustrated in FIG. 6B, on the insulating layer 306 passing between the first pad 303 and the second pad 304, a first section 306*a* and a third section 306*c* having a first gap G1 between the first pad 303 and the second pad 304, and a second section 306*b* having a second gap G2 larger than the first gap G1 are present. The second section 306*b* is positioned between the first section 306*a* and the third section 306*c* in the extending direction (Y direction) of the runner portion 305*a* of the control electrode 305 covered with the insulating layer 306. The first gap G1 and the second gap G2 are not limited to specific values. The first gap G1 may be, for example, 166 μm. If the lead 4C having a flat bonding surface 401 is used when the first pad 303 and the second pad 304 have such a planar shape, bridges 903 to 905 connecting the first solder 901 on the first pad 303 and the second solder 902 on the second pad 304 may be generated in the first section 306*a* and the third section 306*c*, for example, as illustrated in FIGS. 6D, 6E, and 6F.

The bridges 903 to 905 may be in contact with the upper surface of the insulating layer 306 and the lower surface (bonding surface 401) of the lead 4C, for example, as illustrated in FIGS. 6E and 6F. When the bridges 903 to 905 in such a state are present, the air remaining in a space (void portion) isolated from the external space by the bridge is thermally expanded, and the solder on the bridge portion may be pushed outward and scatter along the extending direction of the insulating layer 306 (runner portion 305*a* of the control electrode 305). The solder that has scattered outward along the extending direction of the insulating layer 306 may adhere to, for example, the surface of the control electrode 305 or the like. The solder adhering to the surface of the control electrode 305 may cause, for example, a connection failure when the bonding wire is connected, or may cause electrical connection between the control electrode 305 and other conductors to be electrically insulated from the control electrode 305.

In addition, in the case of the configuration in which the groove formed on the bonding surface (surface facing the semiconductor element) of the lead is filled with a solder as in WO 2019/244492 A and JP 2012-104709 A, a void may be generated in the solder layer when the groove is filled with the heated and melted solder, and thus the solder may scatter due to the expansion of the void.

Figure 7:
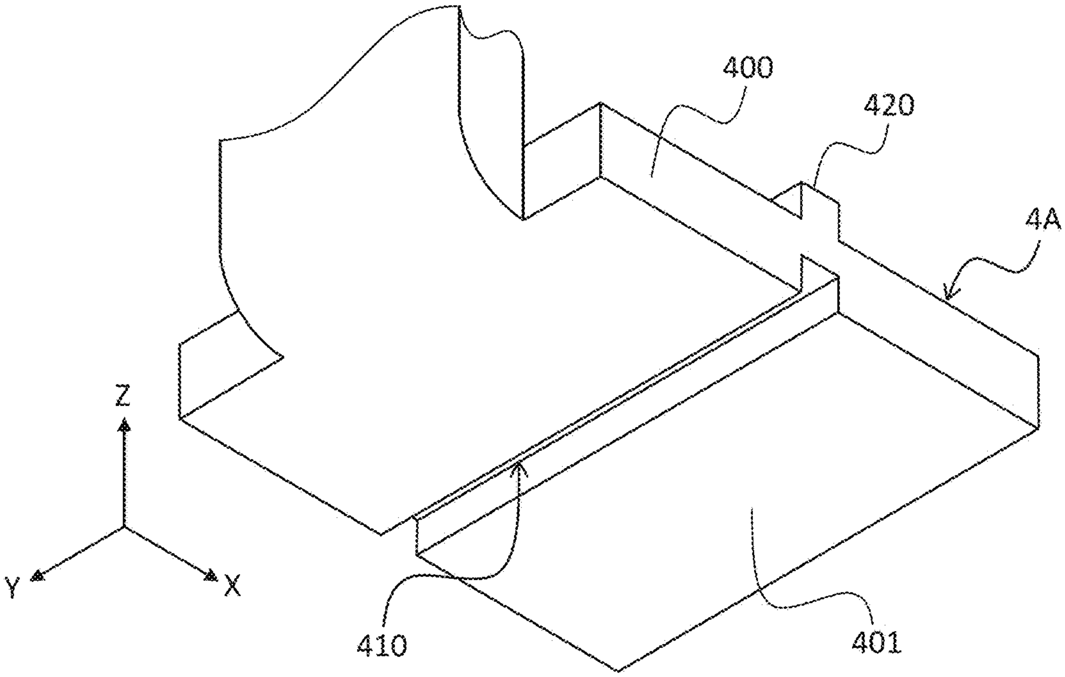
FIG. 7 is a perspective view illustrating a shape of a lead according to an embodiment.
Figure 8:
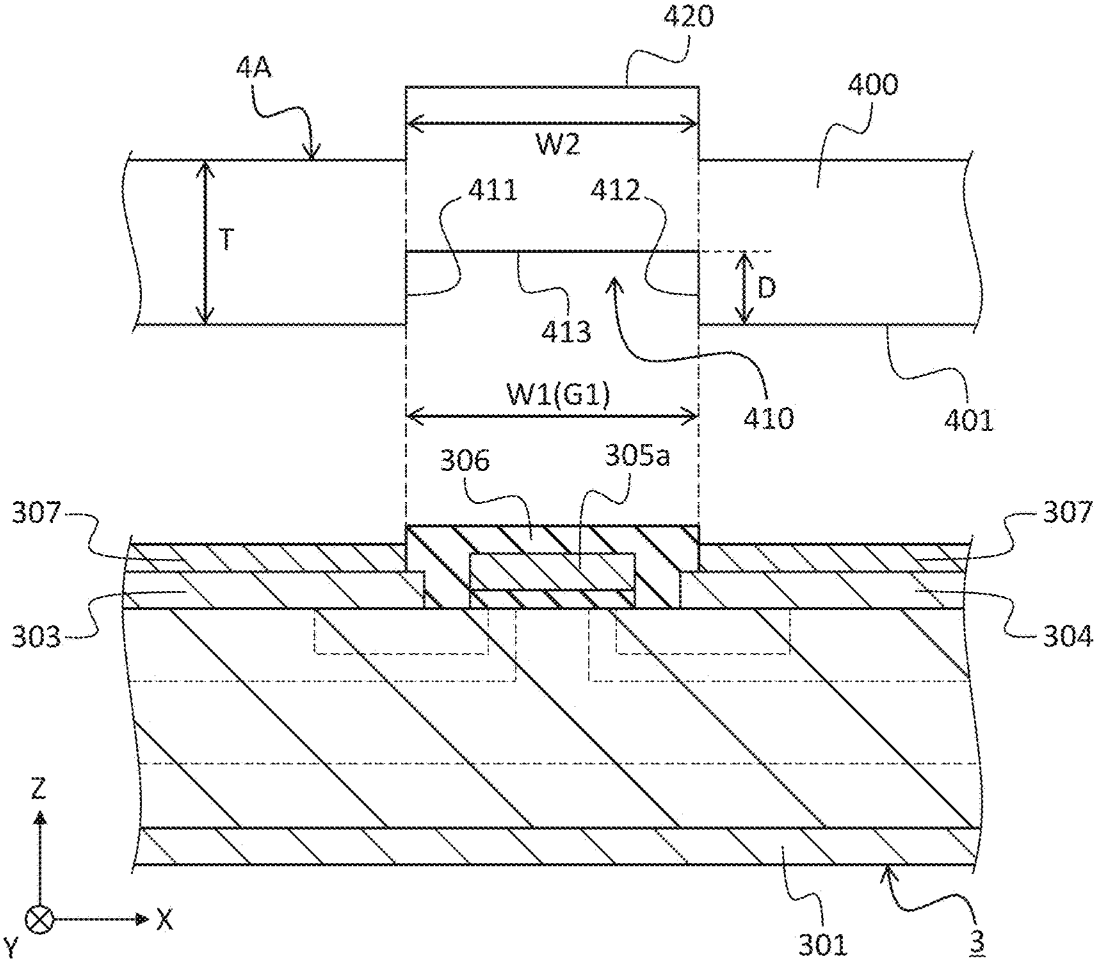
FIG. 8 is a cross-sectional view for explaining the shape of the lead according to the embodiment.
Figure 9:
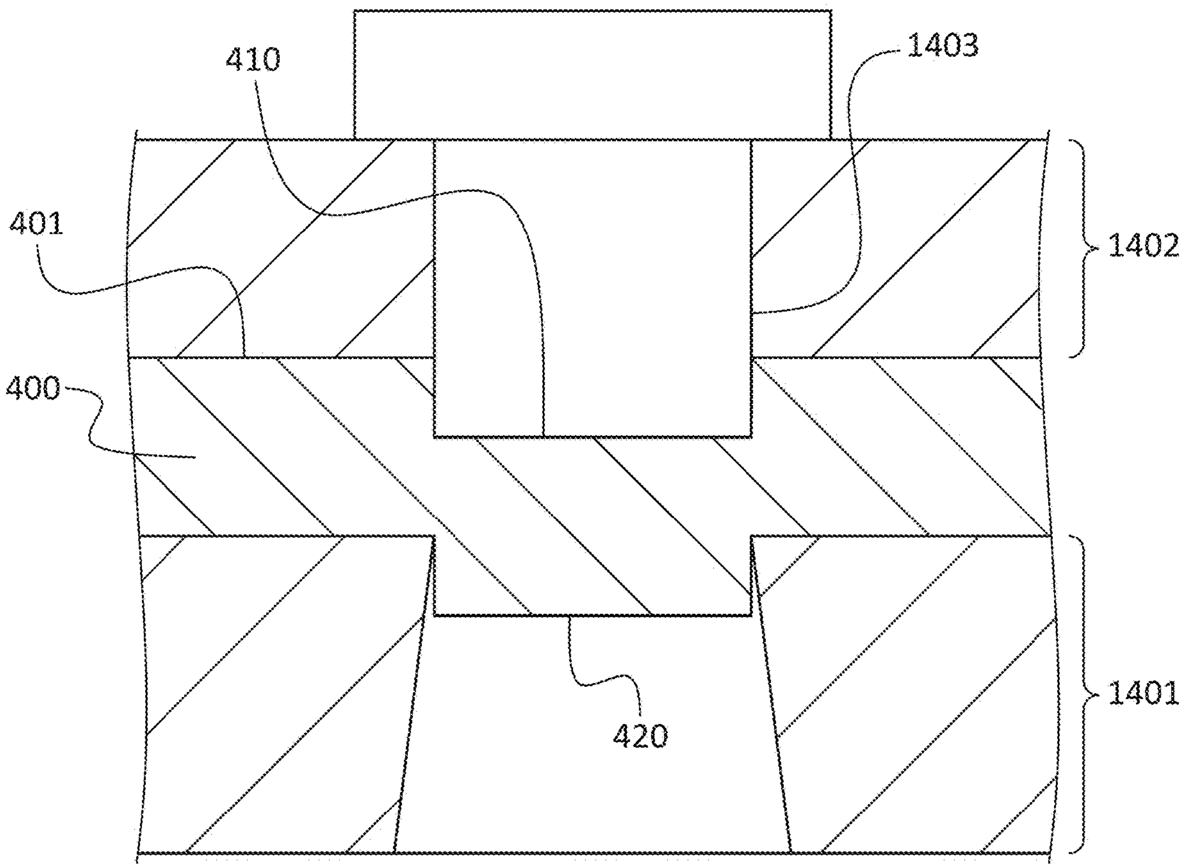
FIG. 9 is a cross-sectional view for explaining an example of a forming method of the lead according to the embodiment.

FIG. 7 is a perspective view illustrating a shape of a lead according to an embodiment. FIG. 8 is a cross-sectional view for explaining the shape of the lead according to the embodiment. FIG. 9 is a cross-sectional view for explaining an example of a forming method of the lead according to the embodiment.

FIGS. 7 and 8 illustrate examples of the shape of a terminal portion 400 having the bonding surface 401 facing the first pad 303 and the second pad 304 in the first lead 4A connected to the second main electrode (the first pad 303 and the second pad 304) of the first semiconductor element 3A in the semiconductor device 1 described above with reference to FIGS. 1 and 2. The terminal portion 400 has a recessed portion (recess) 410 having the lower surface (bonding surface) 401 facing the first semiconductor element 3A displaced upward at a portion facing the insulating layer 306 of the first semiconductor element 3A, and extending along the extending direction of the insulating layer 306. A width W1 of the recessed portion 410 is only required to be equal to or larger than the first gap G1 between the first pad 303 and the second pad 304 in the first semiconductor element 3A. For example, when the first gap G1 is 166 μm, the width W1 of the recessed portion 410 may be 166 μm or more. A depth D of the recessed portion 410 is set to a depth smaller than the depth corresponding to a thickness T of the terminal portion 400 such that the inside of the recessed portion 410 is not filled with the melted solder.

As illustrated in FIGS. 7 and 8, the recessed portion 410 of the terminal portion 400 of the first lead 4A preferably has a shape such that only a portion forming the recessed portion 410 in the terminal portion 400 (in other words, a portion facing the insulating layer 306 of the semiconductor element 3) is displaced upward and protrudes. Furthermore, the recessed portion 410 preferably has a shape such that each of a first wall surface 411 and a second wall surface 412 facing each other is orthogonal to the lower surface of the terminal portion 400 (a bottom surface 413 of the recessed portion 410). The recessed portion 410 having such a shape can, for example, suppress the inflow of melted solder into the recessed portion 410 and can suppress the filling of the recessed portion 410 with the solder.

The method for forming the recessed portion 410 of the terminal portion 400 illustrated in FIGS. 7 and 8 is not limited to a specific method. The recessed portion 410 can be formed, for example, by half punching (half cutting/half-blanking) using a die (punch die) to form a half-punched portion (half-blanked portion/pressed convex-concave portion) in the terminal portion 400, as illustrated in FIG. 9. The half punching is processing in which the terminal portion 400 of the first lead 4A is sandwiched between a die 1401 and a stripper 1402, and a punch 1403 is pushed into the terminal portion 400 to deform the terminal portion to such an extent that the terminal portion 400 does not come off. The terminal portion 400 is displaced downward only at a portion pressed by the punch 1403 to form a convex portion 420 opposite to the recessed portion 410.

Figure 10A:
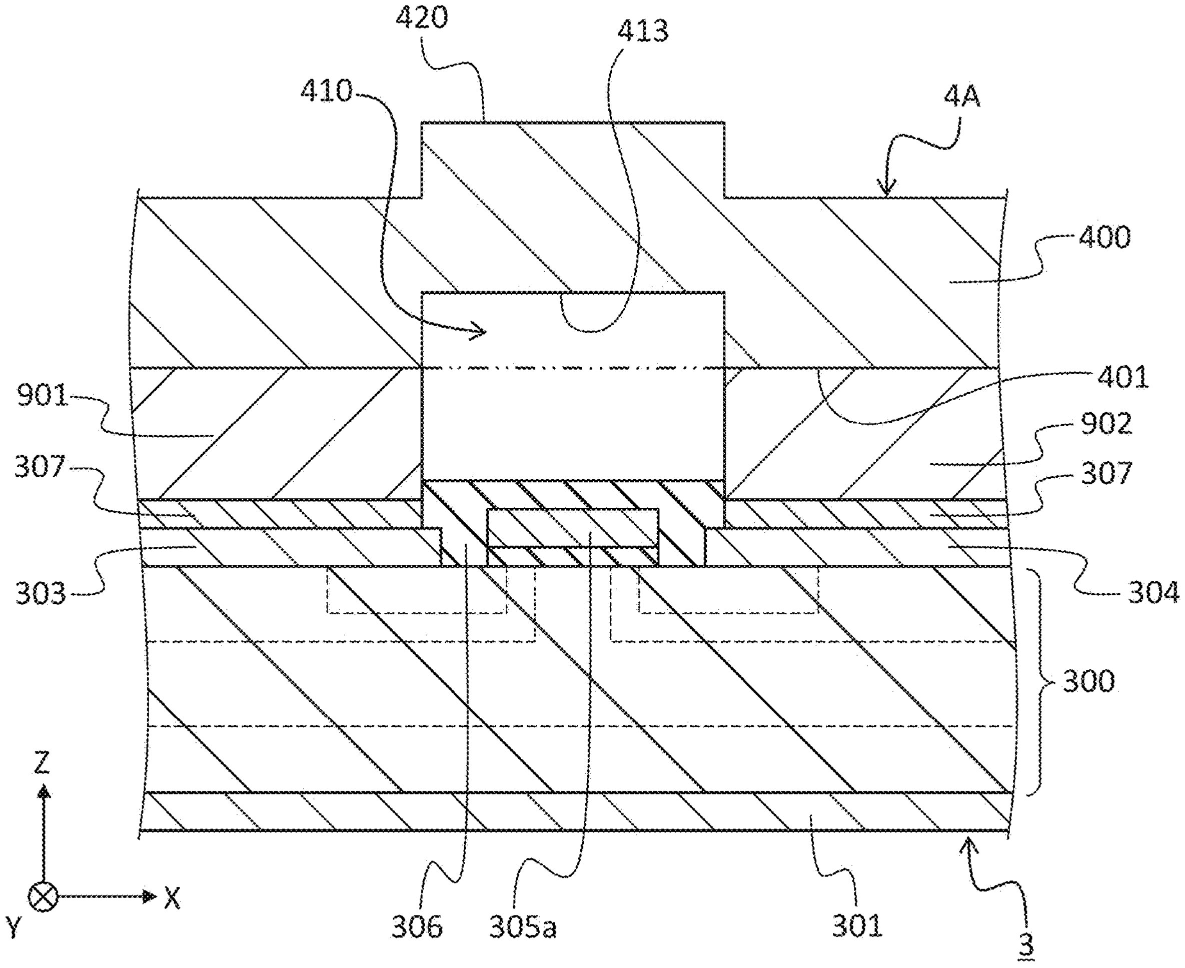
FIG. 10A is a cross-sectional view illustrating a state of the melted bonding material in a step of bonding the lead according to the embodiment.
Figure 10B:
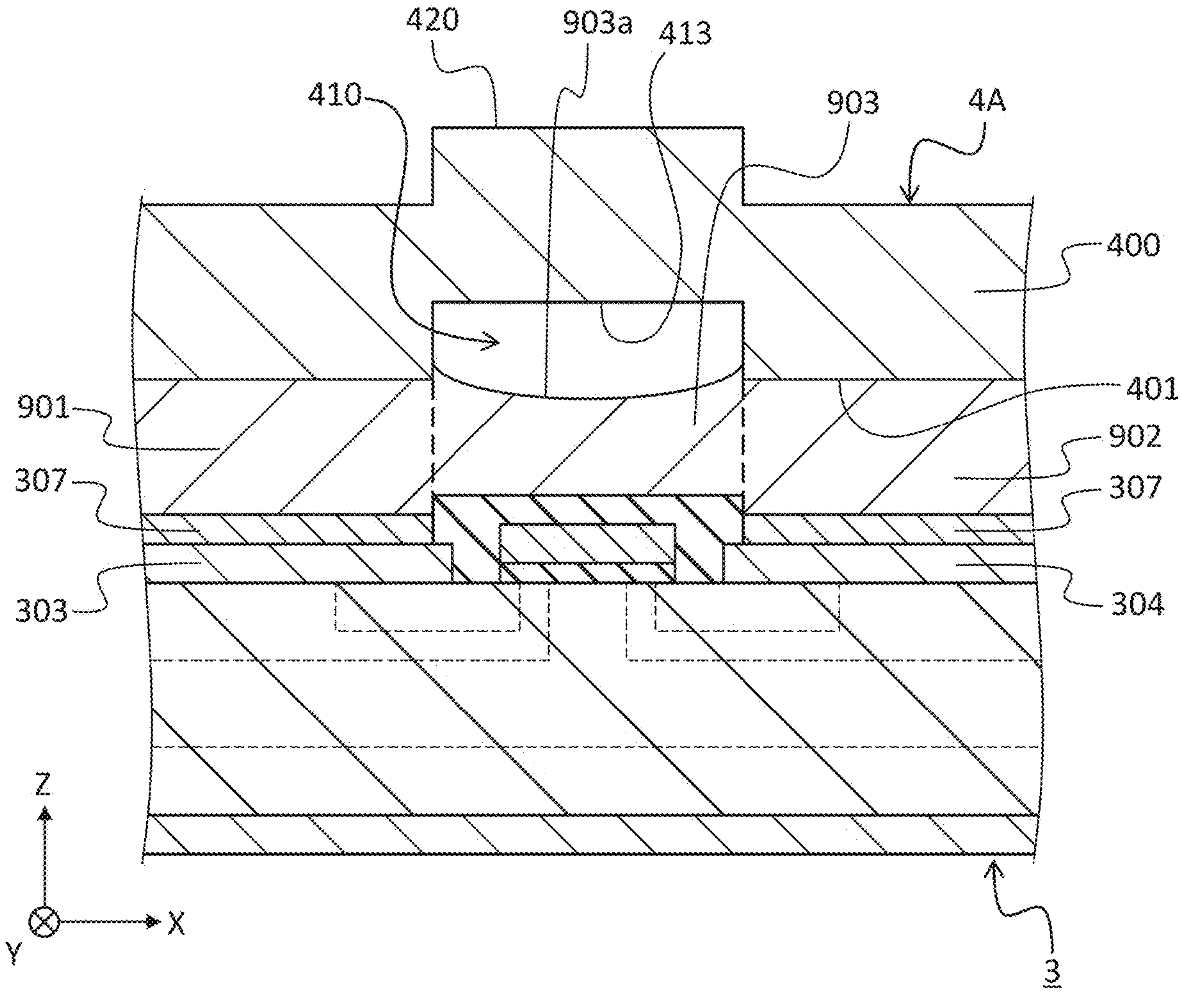
FIG. 10B is a cross-sectional view illustrating the state of the melted bonding material in the step of bonding the lead according to the embodiment.
Figure 10C:
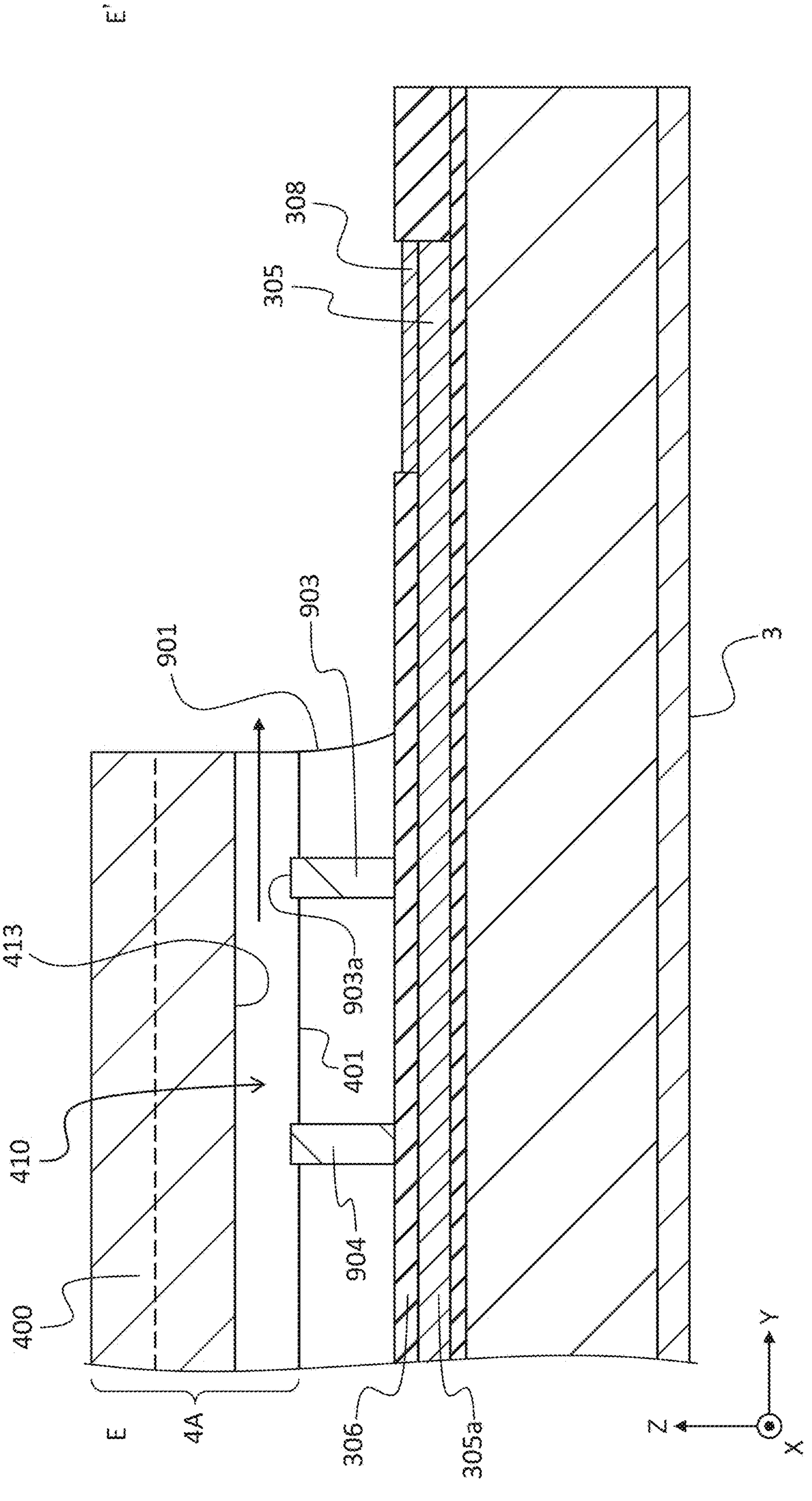
FIG. 10C is a cross-sectional view illustrating the state of the melted bonding material in the step of bonding the lead according to the embodiment.

FIG. 10A is a cross-sectional view illustrating a state of the melted bonding material in a step of bonding the lead according to the embodiment. FIG. 10B is a cross-sectional view illustrating the state of the melted bonding material in the step of bonding the lead according to the embodiment. FIG. 10C is a cross-sectional view illustrating the state of the melted bonding material in the step of bonding the lead according to the embodiment.

When the first lead 4A illustrated in FIGS. 7 and 8 is used instead of the lead 4C illustrated in FIG. 6A, and when the plate-shaped solder 9 is disposed between the first semiconductor element 3A and the first lead 4A, a portion of the upper surface of the plate-shaped solder 9 facing the recessed portion 410 is not in contact with the first lead 4A. In other words, the upper surface of the plate-shaped solder 9 is in contact with the first lead 4A in two separate regions, a region overlapping the first pad 303 and a region overlapping the second pad 304 of the first semiconductor element 3A in a plan view. Therefore, when the plate-shaped solder 9 is heated and melted, the solder is separated into the first solder 901 on the first pad 303 and the second solder 902 on the second pad 304, for example, as illustrated in FIG. 10A, due to the surface tension of the melted solder, low wettability to the insulating layer 306, and the like.

In addition, also when the first lead 4A having the recessed portion 410 is used, the above-described bridges 903 to 905 may be generated on the insulating layer 306 in the process of separating the melted solder into the first solder 901 and the second solder 902. However, the recessed portion 410 having the bottom surface 413 displaced upward is formed at the position facing the insulating layer 306 on the lower surface of the terminal portion 400 of the first lead 4A. For this reason, when the bridges 903 to 905 are generated on the insulating layer 306, for example, as illustrated in FIGS. 10B and 10C, a hole that communicates two spaces separated by the bridge 903 is formed by the upper surface 903*a* of the bridge 903, and the wall surfaces 411 and 412 and the bottom surface 413 of the recessed portion 410 of the first lead 4A. In other words, the region not in contact with the solder on the bottom surface 413 of the recessed portion 410 becomes continuous from one end to the other end in the extending direction of the recessed portion 410. Thus, in the semiconductor device 1 of the present embodiment, it is possible to prevent the scattering of the melted bonding material due to air expansion caused by the generation of a void inside the heated and melted solder. Therefore, in the semiconductor device 1 according to the present embodiment, it is possible to prevent the occurrence of the malfunction of the semiconductor device due to the scattering of the bonding material that bonds the main electrode of the semiconductor element 3 and the conductor plate.

Although not described in detail with reference to the drawings, the second lead 4B electrically connected to the second main electrodes 303, 304 on the upper surface of the second semiconductor element 3B has the same configuration as that of the first lead 4A, thereby making it possible to prevent the occurrence of the malfunction of the semiconductor device due to the scattering of the bonding material. Specifically, the terminal portion of the second lead 4B having the bonding surface facing the second main electrodes 303, 304 on the upper surface of the second semiconductor element 3B forms the recessed portion 410 extending in the extending direction (Y direction in FIG. 1) of the insulating layer 306 that separates the first pad 303 and the second pad 304, which is the extending direction of the runner portion 305*a* in a plan view (top view). Thus, it is possible to prevent the solder remaining on the insulating layer 306 and forming the bridges 903 to 905 from scattering and adhering to the control electrode 305 disposed in the direction extending the insulating layer 306.

Note that the layout of the upper surface electrode of the semiconductor element 3 according to the present embodiment is not limited to the layout described above with reference to FIGS. 1 and 4 and the like. The number of emitter electrodes or source electrodes disposed as the second main electrode on the upper surface of the semiconductor element 3 is not limited to two, and the second main electrode may be divided into three or more, for example. In the terminal portion of the lead electrically connected to the second main electrode divided into three or more, for example, the recessed portion may be formed only at a position overlapping, in a plan view, the insulating layer on which the control electrode not permitting the adhering of the solder that has scattered to a position extended in the extending direction is disposed, among the insulating layers 306 (runner portions 305*a*) dividing the second main electrode.

In addition, the recessed portion 410 described above extends from one end to the other end of the terminal portion 400 in a plan view along the extending direction of the insulating layer 306 (runner portion 305*a*) dividing the second main electrode of the semiconductor element 3. However, as described above with reference to FIG. 6B, the insulating layer 306 dividing the second main electrode of the semiconductor element 3 may have a portion (second section 306*b*) wider than the sections (first section 306*a* and third section 306*c*) on both sides thereof at the central portion in the extending direction. When such a semiconductor element 3 is used, a bridge due to the heated and melted solder is not generated in the second section having a wider insulating layer 306. Therefore, the recessed portion 410 formed on the terminal portion 400 of the lead 4A may be an intermittent one formed only in a section in which a bridge due to the heated and melted solder is likely to be generated on the insulating layer 306 (runner portion 305*a*) dividing the second main electrode of the semiconductor element 3.

Figure 11A:
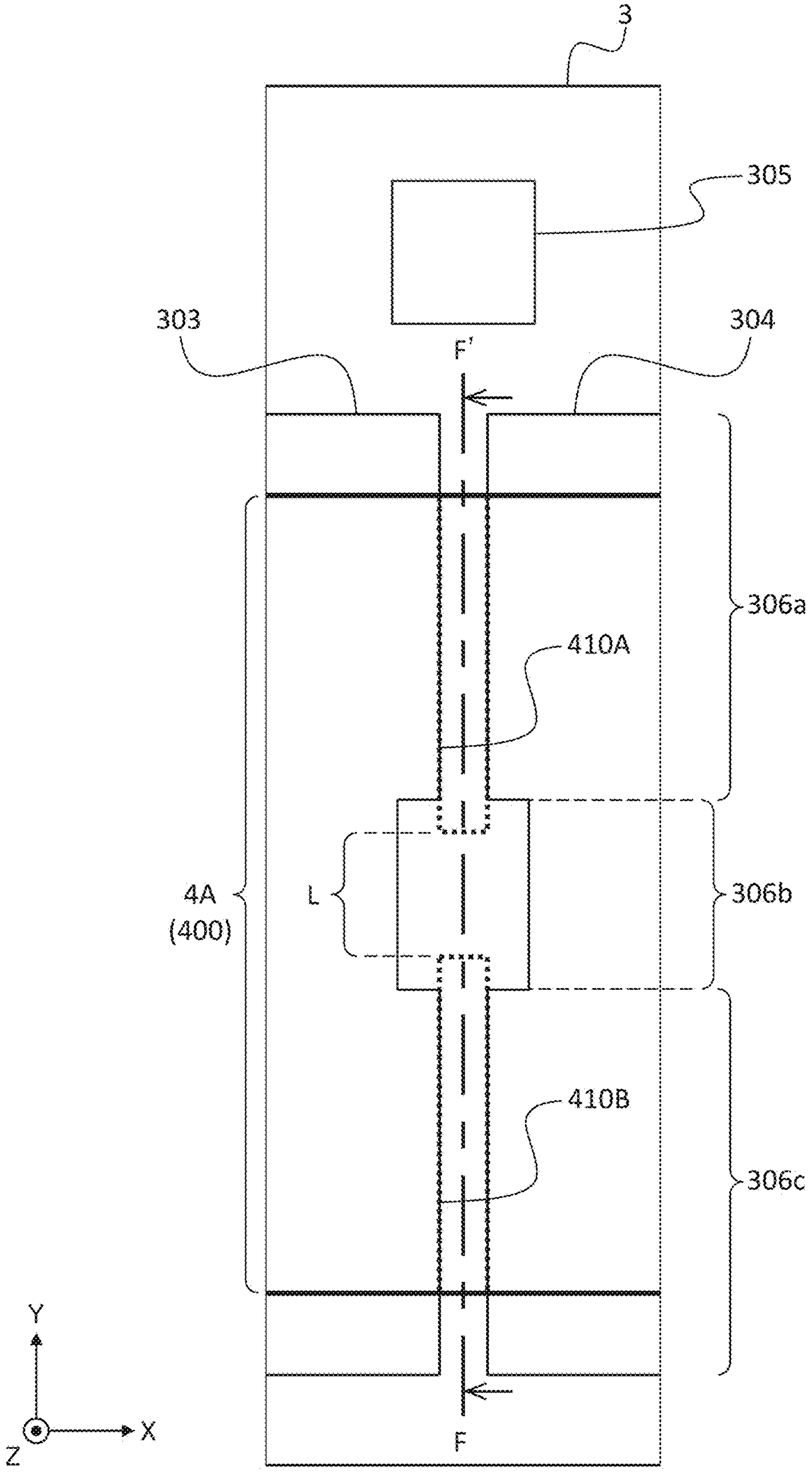
FIG. 11A is a top view illustrating a modification of the shape of the lead.
Figure 11B:
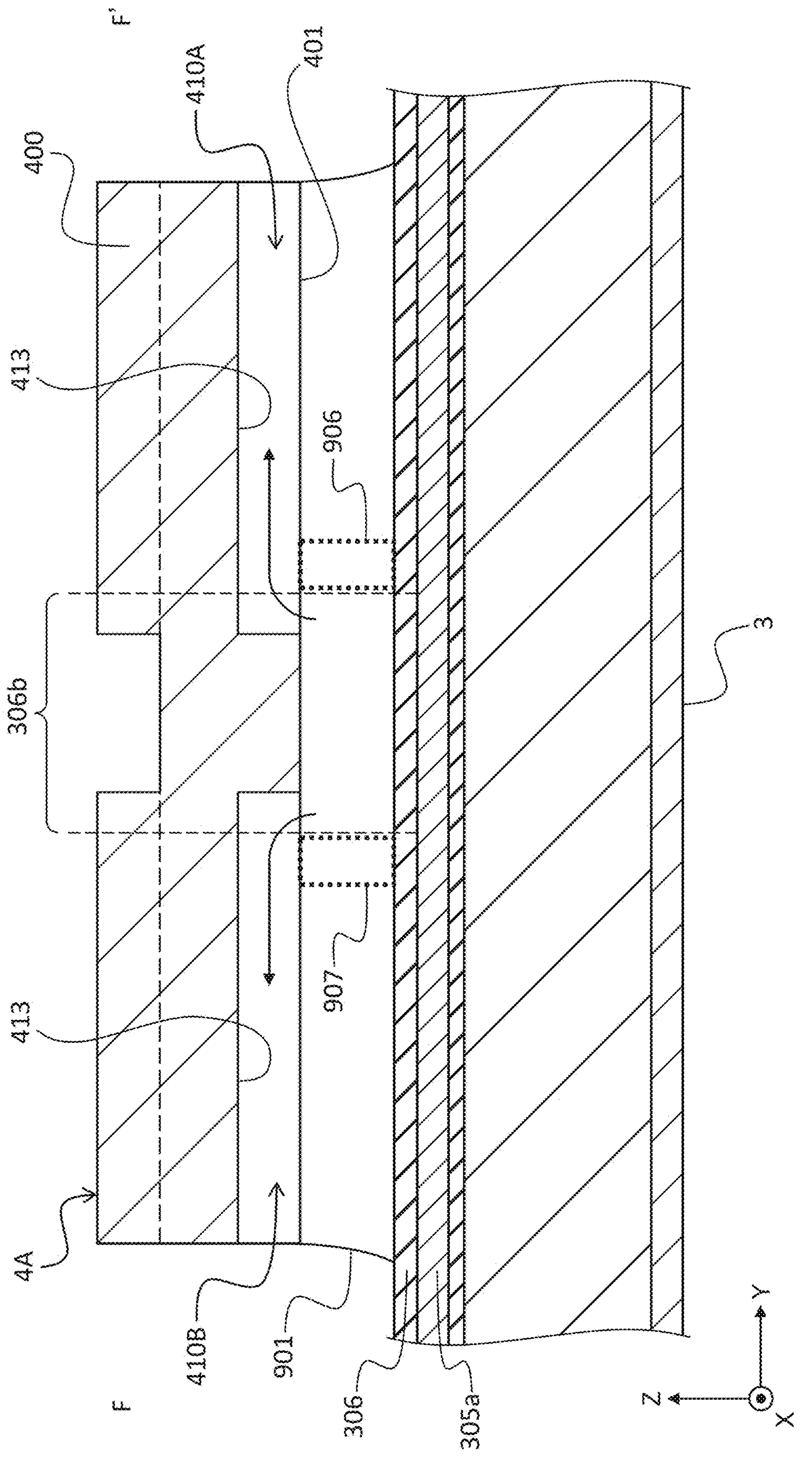
FIG. 11B is a cross-sectional view illustrating a state of the melted bonding material at a position of F-F' line in FIG. 11A.

FIG. 11A is a top view illustrating a modification of the shape of the lead. FIG. 11B is a cross-sectional view illustrating a state of the melted bonding material at a position of F-F' line in FIG. 11A.

On the bonding surface 401 of the terminal portion 400 in the lead 4A illustrated in FIGS. 11A and 11B, a recessed portion discontinuously extends in the Y direction to have a first recessed portion 410A overlapping the first section 306*a* of the insulating layer 306 and a second recessed portion 410B overlapping the third section 306*c* of the insulating layer 306 in a plan view, as indicated by the thick dotted line, are formed. An end of the first recessed portion 410A closer to the center of the terminal portion 400 in a plan view and an end of the second recessed portion 410B closer to the center of the terminal portion 400 in a plan view extend into the second section 306*b* and are separated by a section having a length L in the extending direction. Another end of the first recessed portion 410A forms one outer end of the recessed portion (410A+410B) and another end of the second recessed portion 410B forms another outer end of the recessed portion (410A+410B).

When such first recessed portion 410A and second recessed portion 410B are formed, for example, a region not in contact with the solder on the bottom surface of each recessed portion is continuous from one end to the other end in the extending direction even when bridges 906 and 907 due to the melted solder is generated at a position of the first section closest to the second section and a position of the third section closest to the second section, as indicated by the bold dotted line in FIG. 11B. Thus, it is possible to prevent the air in the void generated by the bridge of the melted solder from expanding and the solder from scattering.

In the lead 4A of the present embodiment, a convex portion 420 corresponding to the recessed portion 410 formed on the lower surface is formed on the upper surface of the terminal portion 400 connected to the second main electrode of the semiconductor element 3. For this reason, when the sealing material 8 is filled in the housing portion 650 of the case 6, the contact area between the upper surface of the terminal portion 400 of the lead 4A and the sealing material 8 increases, and thus the sealing material 8 on the upper surface of the terminal portion 400 is less likely to be peeled off. In addition, when the convex portion generated on the upper surface of the terminal portion 400 is divided into two as illustrated in FIG. 11B, the contact area between the upper surface of the terminal portion 400 of the lead 4A and the sealing material 8 further increases, and thus the sealing material on the upper surface of the terminal portion 400 is less likely to be peeled off. Furthermore, when the convex portion generated on the upper surface of the terminal portion 400 is divided into two, for example, the effect of alleviating the thermal stress generated at the interface between the upper surface of the terminal portion 400 and the sealing material due to a difference in thermal expansion coefficient is enhanced, and thus the sealing material on the upper surface of the terminal portion 400 can be less likely to be peeled off.

The semiconductor device 1 according to the above embodiment is not limited to a specific application. However, in particular, the semiconductor device 1 including the cooler 7 is suitable for use in a high-temperature environment. For example, the semiconductor device 1 according to the above embodiment can be applied to a power conversion device such as an inverter device of an in-vehicle motor or the like. A vehicle to which the semiconductor device 1 according to the present invention is applied is described with reference to FIG. 12.

Figure 12:
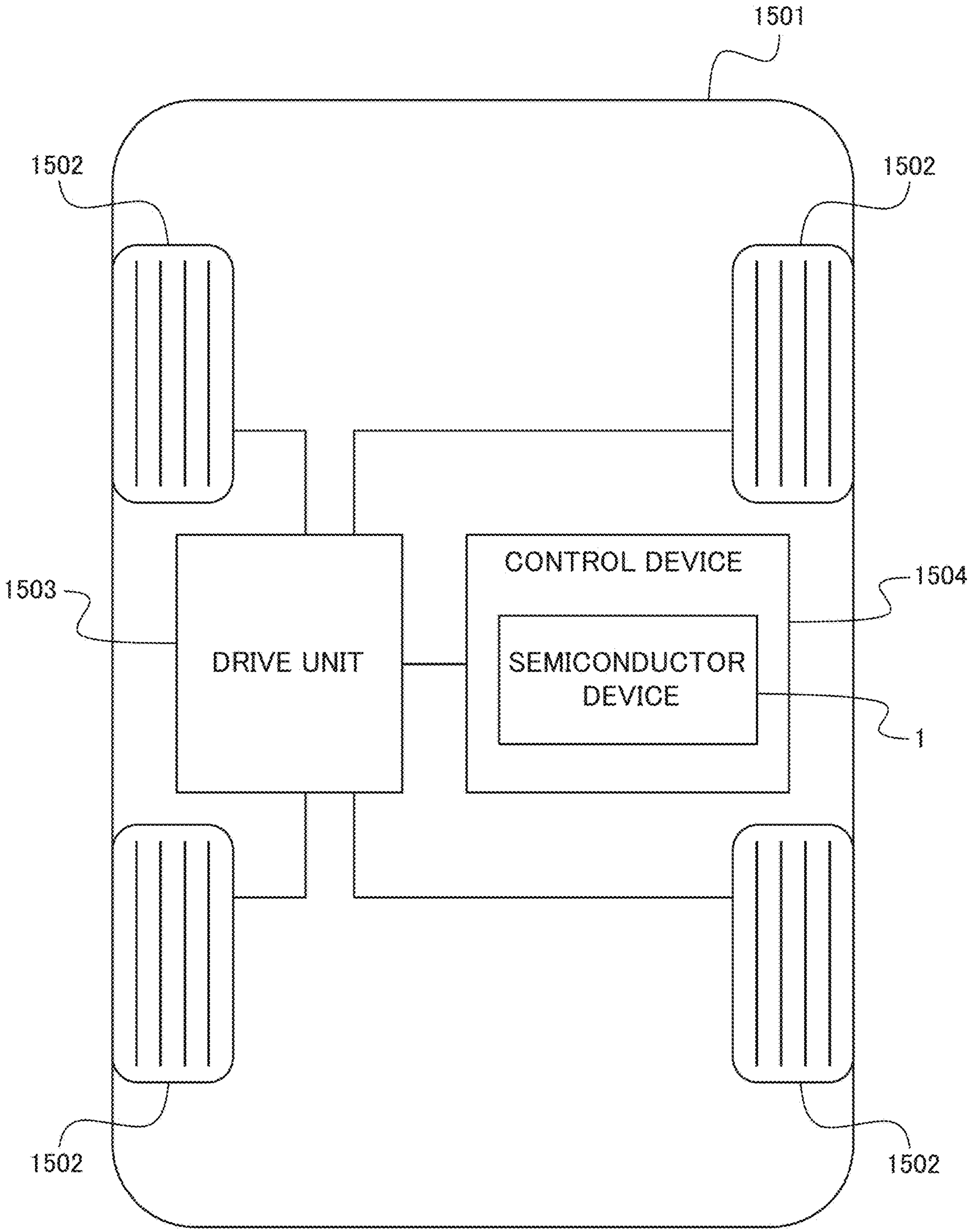
FIG. 12 is a schematic plan view illustrating an example of a vehicle to which the semiconductor device according to the present invention is applied.

FIG. 12 is a schematic plan view illustrating an example of the vehicle to which the semiconductor device according to the present invention is applied. A vehicle 1501 illustrated in FIG. 12 includes, for example, a four-wheeled vehicle including four wheels 1502. The vehicle 1501 may be, for example, an electric vehicle that drives wheels by a motor or the like, or a hybrid vehicle using power of an internal combustion engine in addition to the motor. Furthermore, the vehicle to which the semiconductor device 1 is applied is not limited to a four-wheeled vehicle, and may be a two-wheeled vehicle, a railway vehicle, or the like.

The vehicle 1501 includes a drive unit 1503 that applies power to the wheels 1502 and a control device 1504 that controls the drive unit 1503. The drive unit 1503 may include, for example, at least one of an engine, the motor, and a hybrid of the engine and the motor.

The control device 1504 controls (for example, power control) the drive unit 1503. The control device 1504 includes the semiconductor device 1 including the cooler 7 according to the above-described embodiment. The semiconductor device 1 can be configured to perform power control on the drive unit 1503.

The embodiment of the semiconductor device 1 according to the present invention is not limited to the above embodiment, and various changes, substitutions, and modifications may be made without departing from the spirit of the technical idea. Further, when the technical idea can be realized in another manner by the progress of the technology or another derived technology, the technical idea may be carried out by using a method thereof. Therefore, the claims cover all embodiments that may be included within the scope of the technical idea.

Feature points in the embodiment described above will be summarized below.

A semiconductor device according to the above-described embodiment includes a wiring board, a semiconductor element disposed on the wiring board, and a lead bonded to a main electrode provided on an upper surface of the semiconductor element by a bonding material, in which the main electrode of the semiconductor element includes a first pad and a second pad separated by an insulating layer extending in a first direction, the lead has a recessed portion having a bottom surface displaced to an upper surface side opposite to a bonding surface facing the main electrode of the semiconductor element and extending in the first direction at a position of the bonding surface facing the insulating layer, and the recessed portion of the lead has at least one end of both ends in the first direction positioned at an end of the lead in the first direction in a plan view of the bonding surface, and a region of the bottom surface not in contact with the bonding material is continuous from one end to the other end of the recessed portion in the first direction.

In the semiconductor device according to the above-described embodiment, the semiconductor element further includes a conductive runner portion that is disposed on the upper surface and extends in the first direction inside the insulating layer that separates the first pad and the second pad, and a control electrode that is connected to one end of the runner portion in the first direction and is exposed on the upper surface, and the control electrode is exposed at a position where the recessed portion of the lead extends in the first direction.

In the semiconductor device according to the above-described embodiment, the recessed portion of the lead extends from one end to the other end of the lead in the first direction in a plan view of the bonding surface.

In the semiconductor device according to the above-described embodiment, the insulating layer separates the first pad and the second pad such that a second section in which a gap between the first pad and the second pad is a second gap larger than a first gap is present between a first section and a third section in which the gap between the first pad and the second pad is the first gap, and a separate recessed portion having one end in the second section in a plan view of the bonding surface and the other end extending to an end of the lead in the first direction is provided at a position of the bonding surface of the lead facing the insulating layer.

In the semiconductor device according to the above-described embodiment, a width of the recessed portion of the lead in a plan view of the bonding surface is equal to or larger than the first gap.

In the semiconductor device according to the above-described embodiment, the recessed portion of the lead is formed by displacing a portion of the lead facing the insulating layer by half punching.

In the semiconductor device according to the above-described embodiment, a bridge of a bonding material that is connected to a first bonding material on the first pad and a second bonding material on the second pad and is separated from a bottom surface of the recessed portion of the lead is provided on the insulating layer of the semiconductor element.

The semiconductor device according to the above-described embodiment further includes a cooler thermally connected to a surface of the wiring board opposite to a surface on which the semiconductor element is disposed.

The vehicle according to the above-described embodiment includes the semiconductor device according to the above-described embodiment.

As described above, the present invention can prevent the occurrence of the malfunction of the semiconductor device due to the scattering of the bonding material that bonds the main electrode of the semiconductor element and the conductor plate, and is particularly useful for an industrial or electrical semiconductor device used as a power conversion device, and a vehicle.

What is claimed is:

1. A semiconductor device, comprising:

a wiring board;

a semiconductor element disposed on the wiring board, the semiconductor element including a main electrode, which includes a first pad and a second pad, provided on an upper surface thereof and an insulating layer extending a first direction between the first pad and the second pad on the upper surface thereof to separate the first pad and the second pad from each other; and a lead having a bonding surface that is bonded to the main electrode of the semiconductor element by a bonding material and having an upper surface opposite to the bonding surface, wherein the lead at its bonding surface has a recess that faces the main electrode of the semiconductor element so as to overlap the insulating layer in a plan view of the semiconductor device, is recessed toward the upper surface of the lead, and extends in the first direction, the recess having two outer ends opposite to each other in the first direction, one of the two outer ends of the recess overlapping one end of the lead in the plan view, the recess having a bottom surface that faces the main electrode of the semiconductor element, is not in contact with the bonding material, and is continuous from the one of the two outer ends thereof to another end thereof in the first direction.

2. The semiconductor device according to claim 1, wherein the semiconductor element further includes:

a conductive runner disposed on the upper surface of the semiconductor element at least partially inside the insulating layer and extending in the first direction; and a control electrode connected to the runner and being exposed from both the insulating layer and the lead on the upper surface of the semiconductor element, and the control electrode is located at a position away from the one of the two outer ends of the recess in the first direction.

3. The semiconductor device according to claim 1, wherein the lead has another end opposite to the one end of the lead in the first direction, the recess extends continuously from the one end of the lead and the another end of the lead.

4. The semiconductor device according to claim 1, wherein the main electrodes include a first section, a second section and a third section, the second section being arranged between the first and third sections in the first direction, the insulating layer being disposed between the first pad and the second pad such that the first and third sections have a first width and the third section has a second width greater than the first width in a second direction orthogonal to the first direction and parallel to the bonding surface, and the recess discontinuously extends from the one end of the lead to the another end of the lead to form a discontinuous recess with two outer ends opposite to each other in the first direction, the discontinuous recess including a first separate recess located at a position facing the first gap of the first section, and having two ends opposite to each other in the first direction, one of the two ends of the first separate recess forming one of the two outer ends of the discontinuous recess and being located at the one end of the lead, another of the two ends of the first separate recess being located in the second section, and a second separate recess located at a position facing the first gap of the third section, and having two ends opposite to each other in the first direction, one of the two ends of the second separate recess forming another of the two outer ends of the recess and being located at another end of the lead opposite to the one end of the lead in discontinuous the first direction, another of the two ends of the second separate recess being located in the second section.

5. The semiconductor device according to claim 4, wherein a width of each of the first separate recess and the second separate recess of the lead in the second direction is equal to or larger than the first width.

6. The semiconductor device according to claim 1, wherein the recess is formed by displacing a portion of the lead facing the insulating layer by half-punching.

7. The semiconductor device according to claim 1, further comprising a bridge of a bonding material provided on the insulating layer of the semiconductor element and connecting a first bonding material, which bonds the lead to the first pad, to a second bonding material, which bonds the lead to the second pad, the bridge being out of contact with the bottom surface of the recess.

8. The semiconductor device according to claim 1, further comprising a cooler thermally connected to a surface of the wiring board opposite to a surface on which the semiconductor element is disposed.

9. A vehicle comprising the semiconductor device according to claim 1.

* * * * *